US006630724B1

(12) United States Patent
Marr

(10) Patent No.: US 6,630,724 B1
(45) Date of Patent: Oct. 7, 2003

(54) GATE DIELECTRIC ANTIFUSE CIRCUITS AND METHODS FOR OPERATING SAME

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,429

(22) Filed: Aug. 31, 2000

(51) Int. Cl.[7] .............................................. H01L 29/00
(52) U.S. Cl. ............. 257/530; 365/189.05; 365/189.09; 365/225.7
(58) Field of Search ...................... 257/530; 365/189.05, 365/189.09, 225.7

(56) References Cited

U.S. PATENT DOCUMENTS

| | | | |
|---|---|---|---|
| 4,748,490 A | 5/1988 | Hollingsworth | 357/51 |
| 5,110,754 A | 5/1992 | Lowrey, et al. | 437/52 |
| 5,299,150 A | 3/1994 | Galbraith et al. | 365/94 |
| 5,376,566 A | 12/1994 | Gonzalez | 437/5 |
| 5,379,250 A | 1/1995 | Harshfield | 365/105 |
| 5,439,835 A | 8/1995 | Gonzalez | 437/55 |
| 5,646,879 A | 7/1997 | Harshfield | 365/105 |
| 5,661,045 A | 8/1997 | Manning et al. | 438/286 |

(List continued on next page.)

OTHER PUBLICATIONS

Candelier, P., et al., "One Time Programmable Drift Antifuse Cell Reliability", IEEE International Reliability Physics Symposium Proceedings, San Jose, Ca, pp. 169–173, (2000).

Dabral, S., et al., *Basic ESD and I/O design*, John Wiley & Sons, Inc, New York, pp. 260–263, (1998).

(List continued on next page.)

*Primary Examiner*—Ngân V. Ngô
(74) *Attorney, Agent, or Firm*—Schwegman, Lundberg, Woessner & Kluth, P.A.

(57) ABSTRACT

A number of antifuse support circuits and methods for operating them are disclosed according to embodiments of the present invention. An external pin is coupled to a common bus line in an integrated circuit to deliver an elevated voltage to program antifuses in a programming mode. An antifuse having a first terminal coupled to the common bus line is selected to be programmed by a control transistor in a program driver circuit coupled to a second terminal of the antifuse. The program driver circuit has a high-voltage transistor with a diode coupled to its gate to bear a portion of the elevated voltage after the antifuse has been programmed. The program driver circuit also has an impedance transistor between the high-voltage transistor and the control transistor to reduce leakage current and the possibility of a snap-back condition in the control transistor. A read circuit includes a transistor coupled between a read voltage source and the second terminal to read the antifuse in an active mode. The common bus line may be coupled to a reference voltage through a common bus line driver circuit in the active mode to pass current to or from the read circuit. The common bus line driver circuit has a control transistor and a high-voltage transistor with a diode coupled to its gate to bear the elevated voltage on the common bus line during the programming mode. The read circuit may have a latch circuit to latch a state of the antifuse in a sleep mode. A floating well driver logic circuit raises the voltage potential of wells and gate terminals of p-channel transistors in the read circuit during the programming mode to reduce current flow from the common bus line.

34 Claims, 25 Drawing Sheets

U.S. PATENT DOCUMENTS

| | | | |
|---|---|---|---|
| 5,714,786 A | 2/1998 | Gonzalez et al. | 257/366 |
| 5,724,282 A | 3/1998 | Loughmiller et al. | 365/96 |
| 5,742,555 A | 4/1998 | Marr et al. | 365/225.7 |
| 5,789,796 A | 8/1998 | Kang et al. | 257/530 |
| 5,811,869 A | 9/1998 | Seyyedy et al. | 257/530 |
| 5,838,620 A | 11/1998 | Zagar et al. | 365/200 |
| 5,978,248 A | 11/1999 | Marr et al. | 365/96 |
| 5,998,274 A | 12/1999 | Akram et al. | 438/306 |
| 6,005,273 A | 12/1999 | Gonzalez et al. | 257/366 |
| 6,041,008 A | 3/2000 | Marr | 365/225.7 |
| 6,090,693 A | 7/2000 | Gonzalez et al. | 438/592 |
| 6,194,756 B1 | 2/2001 | Gonzalez | 257/305 |
| 6,233,194 B1 | 5/2001 | Marr et al. | 365/225.7 |
| 6,252,293 B1 | 6/2001 | Seyyedy et al. | 257/530 |
| 6,252,422 B1 * | 6/2001 | Patel et al. | 326/80 |
| 6,271,071 B1 | 8/2001 | Gonzalez | 438/238 |
| 6,285,062 B1 | 9/2001 | Marr | 257/361 |
| 6,300,188 B1 | 10/2001 | Gonzalez | 438/239 |
| 6,448,603 B2 | 9/2002 | Gonzalez | 257/306 |
| 6,515,931 B2 | 2/2003 | Marr et al. | 365/225.7 |
| 2001/0051407 A1 | 12/2001 | Tran | 438/241 |

OTHER PUBLICATIONS de Graaf, C., et al., "A Novel High–Density Low–Cost Diode Programmable Read Only Memory", *IEDM Technical Digest*, San Francisco, Ca, pp. 189–192, (1996).

Dobberpuhl, D.W., et al., "A 200–MHz 64–b Dual–Issue CMOS Microprocessor", *IEEE Journal of Solid–State Circuits*, 27(11), pp. 1555–1567, (1992).

Hamdy, E., et al., "Dielectric based antifuse for logic and memory ICs", *IEDM*, San Francisco, Ca, pp. 786–789, (1988).

Hower, P.L., et al., "Snapback and Safe Operating Area of Ldmos Transistors", *IEDM*, pp. 193–196, (1999).

Kalnitsky, A., et al., "CoSi2 integrated fuses on poly silicon for low voltage 0.18 micrometer CMOS applications", *IEDM*, pp. 765–768, (1999).

Lee, H., et al., "THPM 13.4: An Experimental 1 Mb CMOS SRAM with Configurable Organization and Operation", IEEE International Solid–State Circuits Conference, pp. 180–181, 359, (1988).

Ludikhuize, A.W., et al., "Analysis of hot–carrier–induced degradation and snapback in submicron 50V lateral MOS transistors", *IEEE*, pp. 53–56, (1997).

Voldman, S.H., "ESD Protection in a Mixed Voltage Interface and Multi–Rail Diconnected Power Grid Environment in 0.50– and 0.25– micrometer Channel Length CMOS Technologies", EOS/ ESD Symposium, pp. 125–134, (1994).

Marr, Kenneth. W., et al., "A Method of Anti–fuse Repair", *US Application No. 09/845,794 filed on Apr. 30, 2001.*

Marr, Ken. W., et al., "Adjustable High–Trigger–Voltage Electrostatic Discharge Protection Device", *US Application No. 09/933,379 filed May 12, 1999,.*

Marr, Kenneth.W., et al., "Antifuse Structure and Method of Use", *Use Application No. 09/515/760 filed on Mar. 1, 2000,.*

Dabral, Sanjay, et al., *Basic ESD and I/O Design*, (1998), pp. 272.

Schroder, H U., et al., "High Voltage resistant ESD protection circuitry of 0.5um CMOS OTP/EPROM programming pin", *EOS/ESD Symposium*, (1998), pp. 2A.6.1–2A.6.8.

\* cited by examiner

GATE DIELECTRIC ANTIFUSE CIRCUITS AND METHODS FOR OPERATING SAME

FIELD OF THE INVENTION

The present invention relates generally to integrated circuits, and more particularly, to antifuse circuits and methods for operating them.

BACKGROUND

Integrated circuits are interconnected networks of electrical components fabricated on a common foundation called a substrate. The electrical components are typically fabricated on a wafer of semiconductor material that serves as a substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. Memory devices are typically fabricated with redundant memory cells. The redundant memory cells may be enabled with fusible elements after fabrication to replace defective memory cells found during a test of fabricated memory devices. Fusible elements are also used to customize the configuration of a generic integrated circuit after it is fabricated, or to identify an integrated circuit.

One type of fusible element is a polysilicon fuse. The polysilicon fuse comprises a polysilicon conductor fabricated to conduct electrical current on an integrated circuit. A portion of the polysilicon fuse may be evaporated or opened by a laser beam to create an open circuit between terminals of the polysilicon fuse. The laser beam may be used to open selected polysilicon fuses in an integrated circuit to change its configuration. The use of polysilicon fuses is attended by several disadvantages. Polysilicon fuses must be spaced apart from each other in an integrated circuit such that when one of them is being opened by a laser beam the other polysilicon fuses are not damaged. A bank of polysilicon fuses therefore occupies a substantial area of an integrated circuit. In addition, polysilicon fuses cannot be opened once an integrated circuit is placed in an integrated circuit package, or is encapsulated in any manner.

Another type of fusible element is an antifuse. An antifuse comprises two conductive terminals separated by an insulator or a dielectric, and is fabricated as an open circuit. The antifuse is programmed by applying a high voltage across its terminals to rupture the insulator and form an electrical path between the terminals.

Antifuses have several advantages that are not available with fuses. A bank of antifuses takes up much less area of an integrated circuit because they are programmed by a voltage difference that can be supplied on wires connected to the terminals of each of the antifuses. The antifuses may be placed close together in the bank, and adjacent antifuses are not at risk when one is being programmed. Antifuses may also be programmed after an integrated circuit is placed in an integrated circuit package, or encapsulated, by applying appropriate signals to pins of the package. This is a significant advantage for several reasons. First, an integrated circuit may be tested after it is in a package, and may then be repaired by replacing defective circuits with redundant circuits by programming selected antifuses. A generic integrated circuit may be tested and placed in a package before it is configured to meet the specifications of a customer. This reduces the delay between a customer order and shipment. The use of antifuses to customize generic integrated circuits also improves the production yield for integrated circuits because the same generic integrated circuit may be produced to meet the needs of a wide variety of customers.

Despite their advantages, the use of antifuses in integrated circuits is limited by a lack of adequate circuitry to support the programming and reading of the antifuses. There exists a need for improved circuits and methods for programming and reading antifuses in integrated circuits.

SUMMARY OF THE INVENTION

The above mentioned and other deficiencies are addressed in the following detailed description. According to embodiments of the present invention several support circuits have elements to program and read antifuses. An external pin is coupled to a common bus line in an integrated circuit to deliver an elevated voltage to program antifuses in a programming mode. An antifuse having a first terminal coupled to the common bus line is selected to be programmed by a control transistor in a program driver circuit coupled to a second terminal of the antifuse. The program driver circuit has a high-voltage transistor with a diode coupled to its gate to bear a portion of the elevated voltage after the antifuse has been programmed. The program driver circuit also has an impedance transistor between the high-voltage transistor and the control transistor to reduce leakage current and the possibility of a snap-back condition in the control transistor. A read circuit includes a transistor coupled between a read voltage source and the second terminal to read the antifuse in an active mode. The common bus line may be coupled to a reference voltage through a common bus line driver circuit in the active mode to pass current to or from the read circuit. The common bus line driver circuit has a control transistor and a high-voltage transistor with a diode coupled to its gate to bear the elevated voltage on the common bus line during the programming mode. The read circuit may have a latch circuit to latch a state of the antifuse in a sleep mode. A floating well driver logic circuit raises the voltage potential of wells and gate terminals of p-channel transistors in the read circuit during the programming mode to reduce current flow from the common bus line.

The embodiments of the present invention support the programming and reading of antifuses in an integrated circuit, and facilitate all the advantages associated with the use of antifuses in integrated circuits. Other advantages of the present invention will be apparent to one skilled in the art upon an examination of the detailed description.

DETAILED DESCRIPTION

Figure 1:
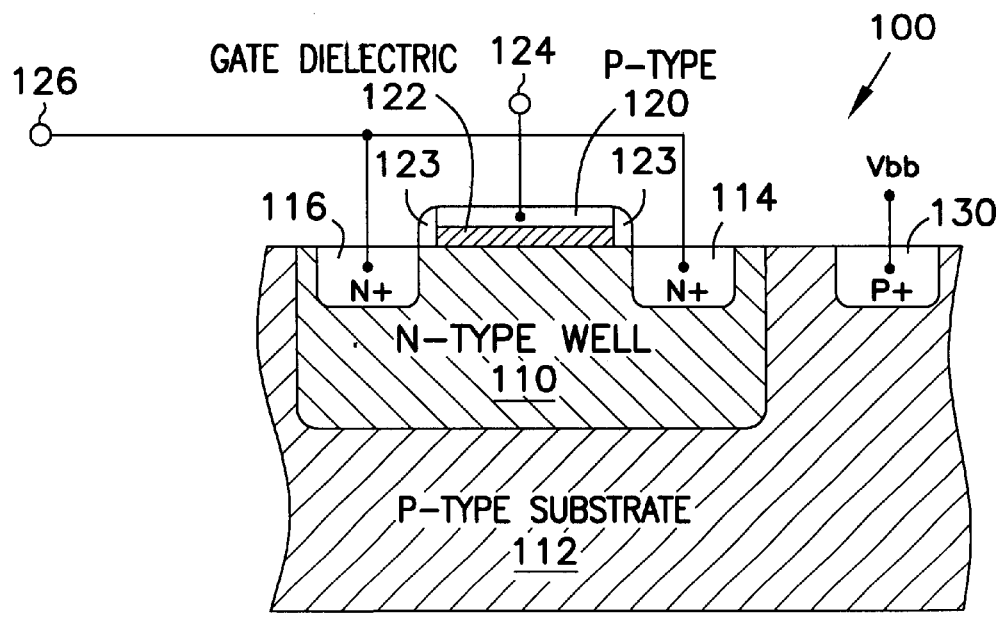
FIG. 1 is a cross-sectional view of an antifuse according to an embodiment of the present invention.

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

The terms wafer and substrate may be used in the following description and include any structure having an exposed surface with which to form an integrated circuit (IC) according to embodiments of the present invention. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on, " "upper," "side" (as in "sidewall"), "higher," "lower," "over" and "under" are defined with respect to the conventional plane or surface being on the top surface of the wafer or substrate, regardless of the orientation of the wafer or substrate.

Antifuses and transistors described herein according to embodiments of the present invention may have wells that may be formed in other wells or tanks rather than substrates. Such wells or tanks may be situated with other wells or tanks, or within other wells or tanks, in a larger substrate. The wells or tanks may also be situated in a silicon-on-insulator (SOI) device.

The term "source/drain" refers generally to the terminals or diffusion regions of a field effect transistor. A terminal or a diffusion region may be more specifically described as a "source" or a "drain" on the basis of a voltage applied to it when the field effect transistor is in operation.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+"

refers to semiconductor material that is heavily doped p-type semiconductor material. The designations "n-" and "p-" refer to lightly doped n and p-type semiconductor materials, respectively.

In this description a transistor is described as being activated or switched on when it is rendered conductive by a control gate voltage that is separated from its source voltage by at least its threshold voltage. The transistor is described as being in an inactive state or switched off when the control gate voltage is separated from its source voltage by less than the threshold voltage and the transistor is rendered non-conductive. A digital signal of 1 may be called a high signal and a digital signal of 0 may be called a low signal. Embodiments of the present invention described herein may be coupled to receive a power supply voltage Vcc which is within approximately 1 to 5 volts. By way of example in this description, and not by way of limitation, Vcc is approximately 3 volts. Two supply voltages, VccX and VccR, may be used in an integrated circuit to improve the noise margin of the embodiments of the invention described herein. VccX is an external supply voltage coupled to the integrated circuit. VccR is a regulated supply voltage generated inside the integrated circuit, and is often less than VccX. By way of example in this description, and not by way of limitation, VccX is approximately 3 volts, and VccR is between 2 volts and 3 volts. Embodiments of the present invention described herein may also be coupled to receive a ground voltage reference Vss, and a bulk node voltage Vbb. The voltage Vbb may be approximately equal to Vss, or may be slightly less than Vss such as approximately minus 1 to minus 2 volts. Vbb is often coupled to p-type wells and p-type substrates in integrated circuits described herein. Vcc, VccX, VccR, Vss, and Vbb are received directly or are generated by circuits that are not shown for purposes of brevity, but are known to those skilled in the art.

A cross-sectional view of an antifuse 100 according to an embodiment of the present invention is shown in FIG. 1. An n-type well 110 is formed in a p-type substrate 112, and an n+-type source diffusion region 114 and an n+-type drain diffusion region 116 are formed in the well 110. Each of the n+-type diffusion regions 114, 116 provide an ohmic contact for the well 110. A p-type gate electrode 120 is formed over a layer of gate dielectric 122 which is formed over the well 110 between the source diffusion region 114 and the drain diffusion region 116. One or more spacers 123 are formed on the sides of the gate dielectric 122 and the gate electrode 120. The gate electrode 120 is connected to a first terminal 124 of the antifuse 100, and a second terminal 126 is connected to each of the n+-type diffusion regions 114, 116. In alternate embodiments of the present invention the gate electrode 120 comprises polysilicon or layers of polysilicon and a silicide such as tungsten silicide (WSi$_x$), titanium silicide (TiSi$_2$), or cobalt silicide (CoSi$_2$). The gate dielectric 122 may be oxide, oxynitride, or nitrided oxide. A p+-type diffusion region 130 is formed in the substrate 112 to provide an ohmic contact coupling the substrate 112 to Vbb.

Two separate circuits in an integrated circuit may be connected respectively to the first and second terminals 124, 126 of the antifuse 100. The antifuse 100 is an open circuit between the terminals until it is programmed in the following manner. The p-type substrate 112 is coupled to Vbb and the first terminal 124 attached to the p-type gate electrode 120 is coupled to a low voltage. The second terminal 126 is coupled to bring the well 110 to a positive elevated voltage, such as approximately 15 volts. A voltage drop between the well 110 and the p-type gate electrode 120 is enough to rupture the gate dielectric 122. When programmed the antifuse 100 has a conductive connection between the first and second terminals 124, 126 which may be biased appropriately such that the p-n junction between the p-type gate electrode 120 and the well 110 allows current to flow. The programmed antifuse 100 is an impedance element similar to a diode between the circuits.

Figure 1A:
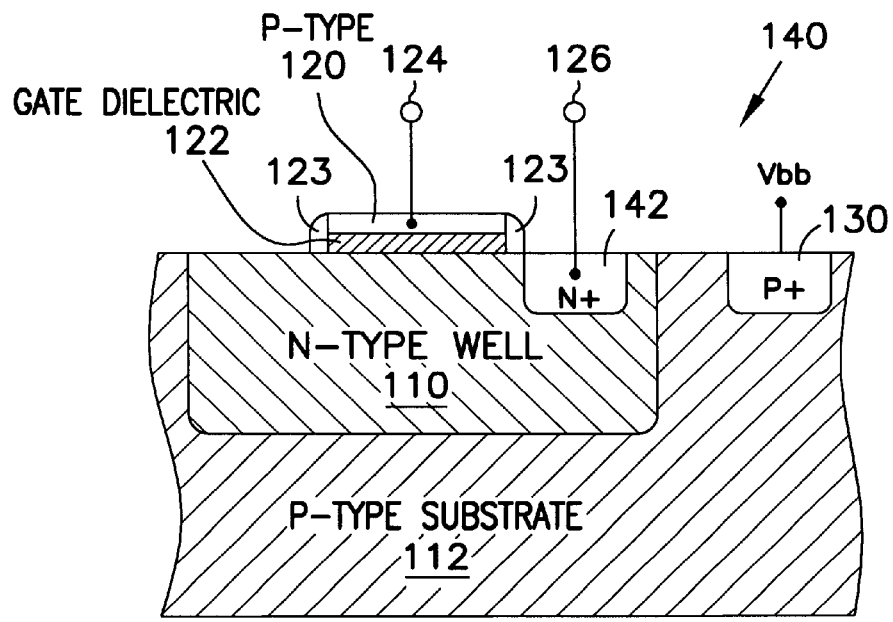
FIG. 1A is a cross-sectional view of an antifuse according to an embodiment of the present invention.

A cross-sectional view of an antifuse 140 according to an embodiment of the present invention is shown in FIG. 1A. The antifuse 140 is similar to the antifuse 100 shown in FIG. 1, and similar elements have been given the same reference numerals and will not be further described for purposes of brevity. The antifuse 140 is one-sided because it has only a single n+-type diffusion region 142. The n+-type diffusion region 142 takes the place of the n+-type diffusion regions 114, 116 in the antifuse 100, and is connected to the second terminal 126. The antifuse 140 is programmed and functions in a manner similar to the antifuse 100.

Figure 1B:
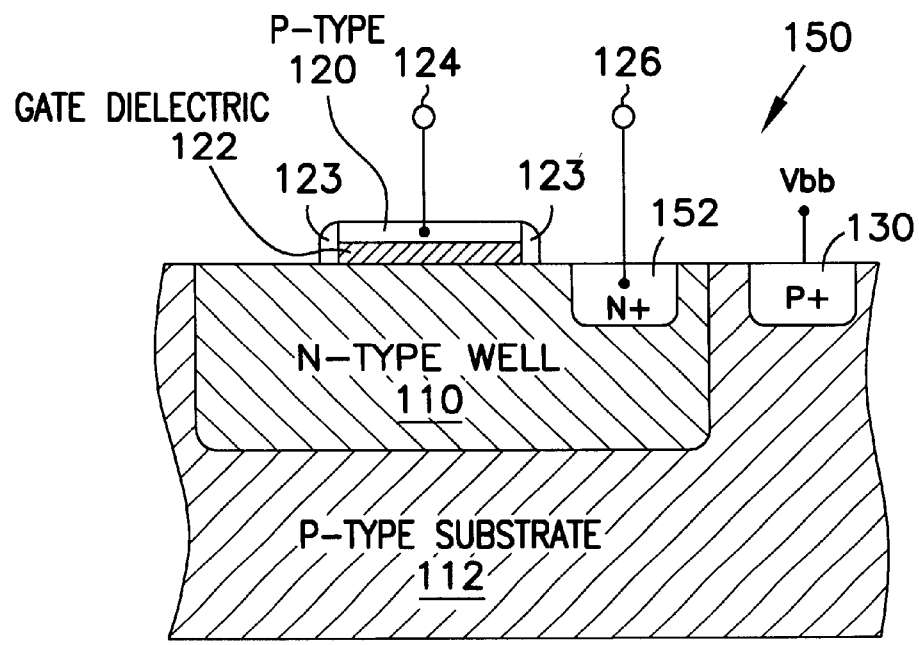
FIG. 1B is a cross-sectional view of an antifuse according to an embodiment of the present invention.

A cross-sectional view of an antifuse 150 according to an embodiment of the present invention is shown in FIG. 1B. The antifuse 150 is similar to the antifuse 100 shown in FIG. 1, and similar elements have been given the same reference numerals and will not be further described for purposes of brevity. The antifuse 150 is offset because it has an n+-type diffusion region 152 that is offset from the gate electrode 120 and the spacers 123. The n+-type diffusion region 152 takes the place of the n+-type diffusion regions 114, 116 in the antifuse 100, and is connected to the second terminal 126. The antifuse 150 is programmed and functions in a manner similar to the antifuse 100.

Figure 2:
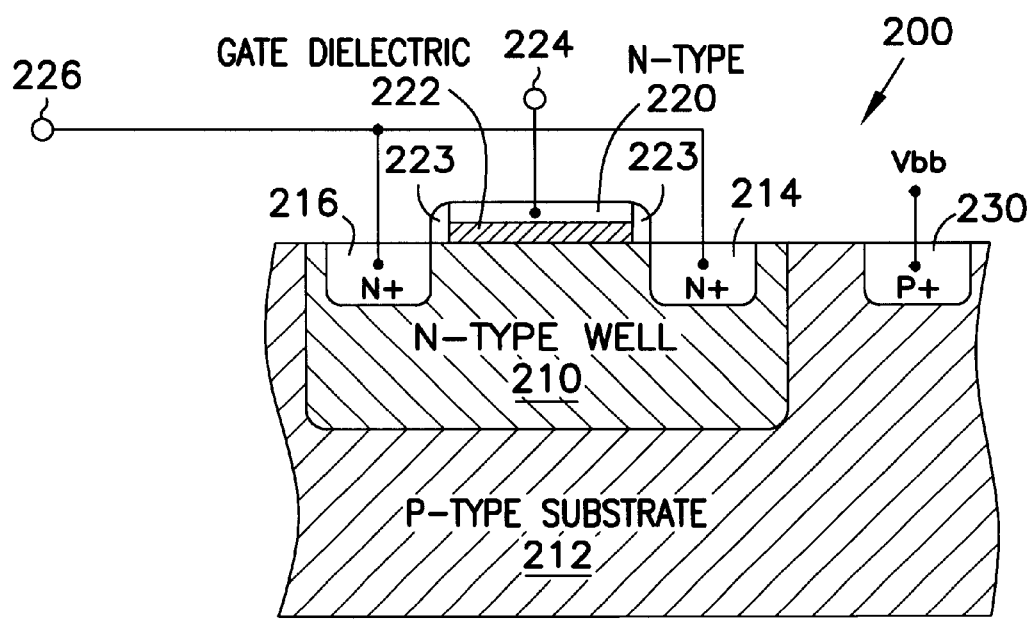
FIG. 2 is a cross-sectional view of an antifuse according to an embodiment of the present invention.

A cross-sectional view of an antifuse 200 according to another embodiment of the present invention is shown in FIG. 2. An n-type well 210 is formed in a p-type substrate 212, and an n+-type source diffusion region 214 and an n+-type drain diffusion region 216 are formed in the well 210. Each of the n+-type diffusion regions 214, 216 provide an ohmic contact for the well 210. An n-type gate electrode 220 is formed over a layer of gate dielectric 222 which is formed over the well 210 between the source diffusion region 214 and the drain diffusion region 216. One or more spacers 223 are formed on the sides of the gate dielectric 222 and the gate electrode 220. The gate electrode 220 is connected to a first terminal 224 of the antifuse 200, and a second terminal 226 is connected to each of the n+-type diffusion regions 214, 216. In alternate embodiments of the present invention the gate electrode 220 comprises polysilicon or layers of polysilicon and a silicide such as tungsten silicide (WSi$_x$), titanium silicide (TiSi$_2$), or cobalt silicide (CoSi$_2$). The gate dielectric 222 may be oxide, oxynitride, or nitrided oxide. A p+-type diffusion region 230 is formed in the substrate 212 to provide an ohmic contact coupling the substrate 212 to Vbb.

The antifuse 200 is an open circuit between the first and second terminals 224, 226 until it is programmed in a manner similar to the programming of the antifuse 100 described above. When programmed the antifuse 200 is an impedance element similar to a resistor between the first and second terminals 224, 226.

Figure 2A:
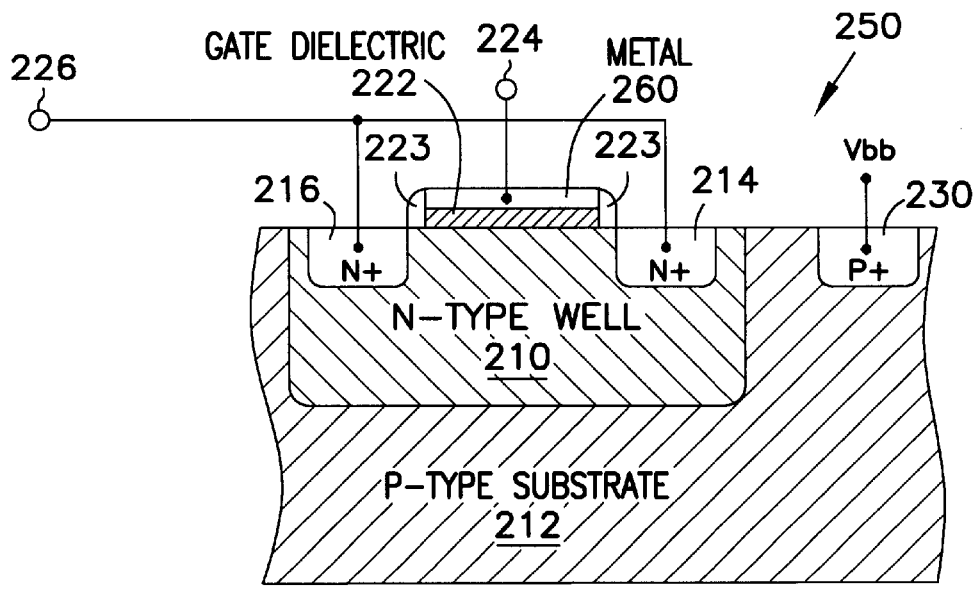
FIG. 2A is a cross-sectional view of an antifuse according to an embodiment of the present invention.

A cross-sectional view of an antifuse 250 according to an embodiment of the present invention is shown in FIG. 2A. The antifuse 250 is similar to the antifuse 200 shown in FIG. 2, and similar elements have been given the same reference numerals and will not be further described for purposes of brevity. The antifuse 250 has a metal gate electrode 260 instead of the gate electrode 220 shown in FIG. 2. The antifuse 250 is programmed and functions in a manner similar to the antifuse 200. Once the antifuse 250 is programmed the metal gate electrode 260 forms a schottky barrier with the n-type well 210. A conductive connection between the first and second terminals 224, 226 in the programmed antifuse 250 may be biased appropriately to allow current to flow through the schottky barrier.

In alternate embodiments of the present invention the antifuses 100, 200 may have only one of the n+-type diffusion regions 114, 116, 214, 216 similar to the antifuse 140. The n+-type diffusion regions 114, 116, 214, 216 may be self-aligned with the respective spacers 123, 223, or may be offset from and not self aligned with the spacers 123, 223 similar to the n+-type diffusion region 152 in the antifuse 150.

The gate dielectrics 122 and 222 may be fabricated to be thinner than gate dielectrics in conventional field effect transistors to reduce the voltage drop necessary to rupture them. Antifuses 100, 140, 150, 200, and 250 with thinner gate dielectrics 122 and 222, respectively, would be programmable with a lower elevated voltage, and thus reduce the effects of the elevated voltage on neighboring circuits which will be described below.

The antifuses 100, 140, 150, 200, and 250 may also be formed in a semiconductor layer formed over an insulator according to alternate embodiments of the present invention.

Figure 3:
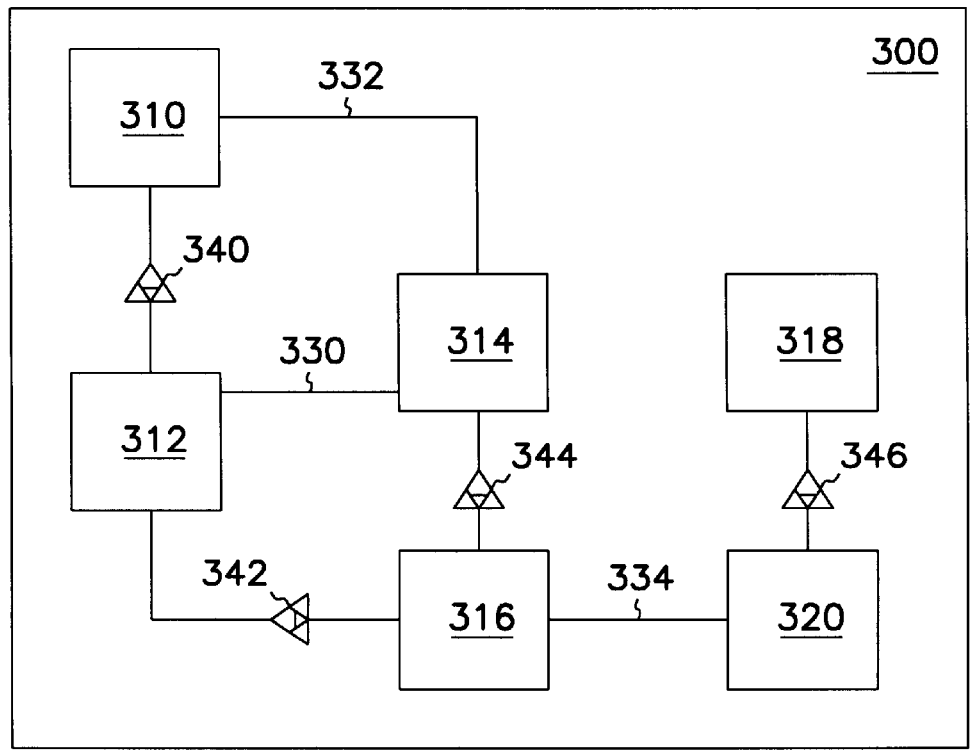
FIG. 3 is an electrical schematic diagram of a portion of an integrated circuit according to an embodiment of the present invention.

The antifuses 100, 140, 150, 200, and 250 described above with reference to FIGS. 1, 1A, 1B, 2, and 2A may be used for a variety of purposes in an integrated circuit. For example, the antifuses 100, 140, 150, 200, and 250 may be programmed to provide a coupling to redundant circuits, to change a configuration of the integrated circuit, to tie a line to a voltage or to Vss, or to provide identification for the integrated circuit. An electrical schematic diagram of a portion of an integrated circuit 300 is shown in FIG. 3 according to an embodiment of the present invention. The integrated circuit 300 may be a memory device, a processor, or any other type of integrated circuit device by way of example and not by way of limitation. The integrated circuit 300 includes a number of circuits 310, 312, 314, 316, 318, and 320 coupled together by a number of direct connections 330, 332, and 334 and a number of antifuses 340, 342, 344, and 346. The antifuses 340–346 are represented by triangles inscribed with the letter A. One or more of the antifuses 340–346 has the structure and the operational method of one of the antifuses shown in FIGS. 1, 1A, 1B, 2, and 2A described above. One or more of the antifuses 340–346 is programmed according to the methods discussed above to provide electrically conductive couplings between two or more of the circuits 310–320 to change the configuration of the integrated circuit 300. The circuits 310–320 may be separate components or devices as well as circuits, and the integrated circuit 300 could include more or less circuits, devices, components, and antifuses according to alternate embodiments of the present invention.

Figure 4:
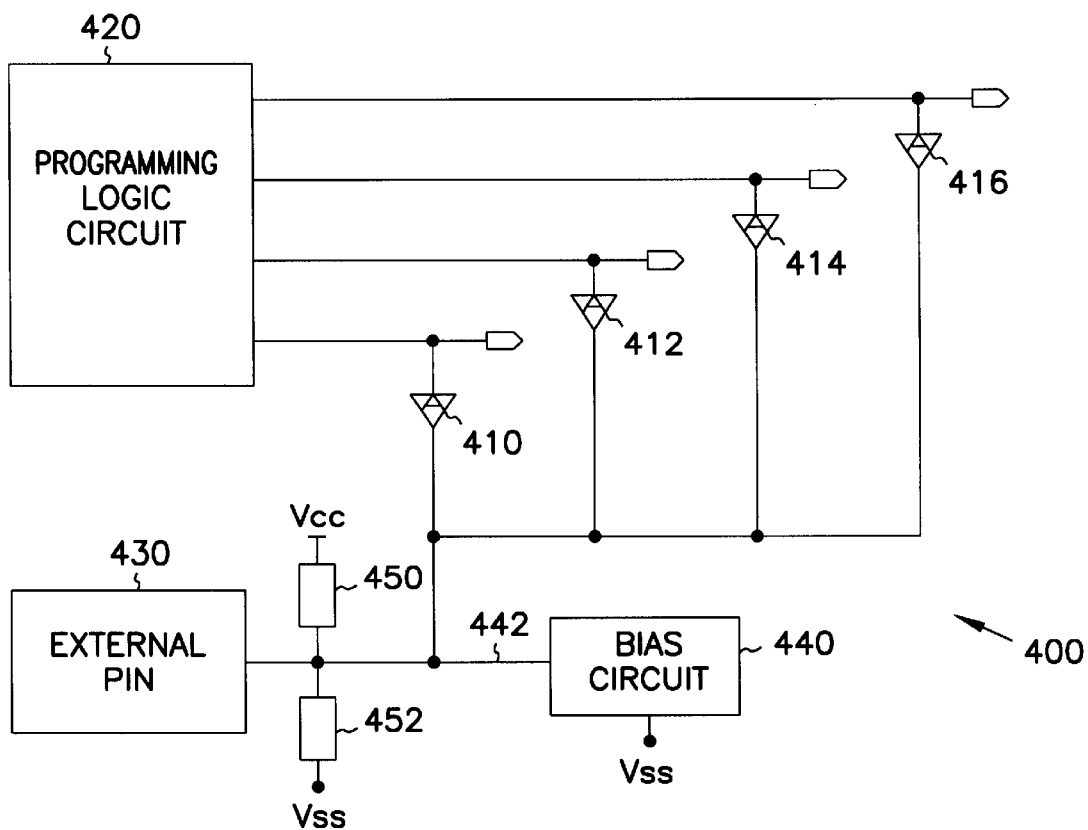
FIG. 4 is an electrical schematic diagram of an antifuse bank according to an embodiment of the present invention.

The antifuses 100, 140, 150, 200, and 250 described above with reference to FIGS. 1, 1A, 1B, 2, and 2A may be arranged in banks of antifuses in an integrated circuit, and an antifuse bank 400 is shown in FIG. 4 according to an embodiment of the present invention. The bank 400 includes four antifuses 410, 412, 414, and 416, one or more having the structure and the operational method of one of the antifuses 100, 140, 150, 200, or 250 described above with respect to FIGS. 1, 1A, 1B, 2, and 2A. The bank 400 may have more or less than four antifuses according to alternate embodiments of the present invention. The antifuses 410–416 are coupled in parallel to a programming logic circuit 420, and each of the antifuses 410–416 may be programmed in a similar manner. For example, the antifuse 410 has a first terminal coupled to the programming logic circuit 420 and a second terminal coupled to an external pin 430 and a bias circuit 440 through a common bus line 442. The first and second terminals correspond to the terminals of one of the antifuses 100, 140, 150, 200, and 250. The external pin 430 is external to an integrated circuit including the bank 400, and will be more fully described hereinbelow. The bias circuit 440 may be a transistor, a group of transistors coupled together, or a high breakdown voltage resistor. The second terminal is also coupled to an electro-static discharge (ESD) device 450, 452 through the common bus line 442.

The bank 400 is operated on one of three modes: a programming mode, an active mode, and a sleep mode. The antifuses 410–416 are programmed in the programming mode, and the active and sleep modes will be described hereinbelow. In the programming mode, an elevated voltage is applied to the external pin 430 and the common bus line 442 that exceeds Vcc of the integrated circuit by a substantial amount. The elevated voltage provides the potential necessary to rupture the gate dielectrics of the anti fuses 410–416 selected to be programmed. The elevated voltage is removed from the external pin 430 during the active and sleep modes and the integrated circuit operates from Vcc. In the active and sleep modes the external pin 430 may be allowed to float, or it may be coupled to a reference voltage such as Vss. The use of the external pin 430 to couple the elevated voltage to the antifuses 410–416 in the programming mode substantially protects other portions of the integrated circuit from damage that may be caused by the elevated voltage.

One of the antifuses 410–416 may be similar to the antifuse 100 shown in FIG. 1, and a programming of the antifuse 100 in the bank 400 will now be described. In the programming mode the p-type substrate 112 is coupled to Vbb and an elevated voltage, such as approximately 15 volts, is coupled to the well 110 from the external pin 430 through the common bus line 442, the second terminal 126, and the diffusion regions 114, 116. The antifuse 100 is selected to be programmed by the programming logic circuit 420 which couples a sufficiently low potential to the p-type gate electrode 120 to rupture the gate dielectric 122 in the antifuse 100. The programming logic circuit 420 may prevent others of the antifuses 410–416 from being programmed by raising a potential of the p-type gate electrodes 120 to prevent the gate dielectrics 122 from being ruptured. The operation of the programming logic circuit 420 will be more fully described hereinbelow according to embodiments of the present invention.

One of the antifuses 410–416 may be similar to one of the antifuses 140, 150, 200, or 250 shown in FIGS. 1A, 1B, 2, and 2A and a programming of one of the antifuses 140, 150, or 200 in the bank 400 will be similar to the programming of the antifuse 100 described above. Those skilled in the art having the benefit of this description will recognize that the voltage levels recited herein may be changed depending on characteristics of the antifuses 410–416 in the bank 400.

Figure 5:
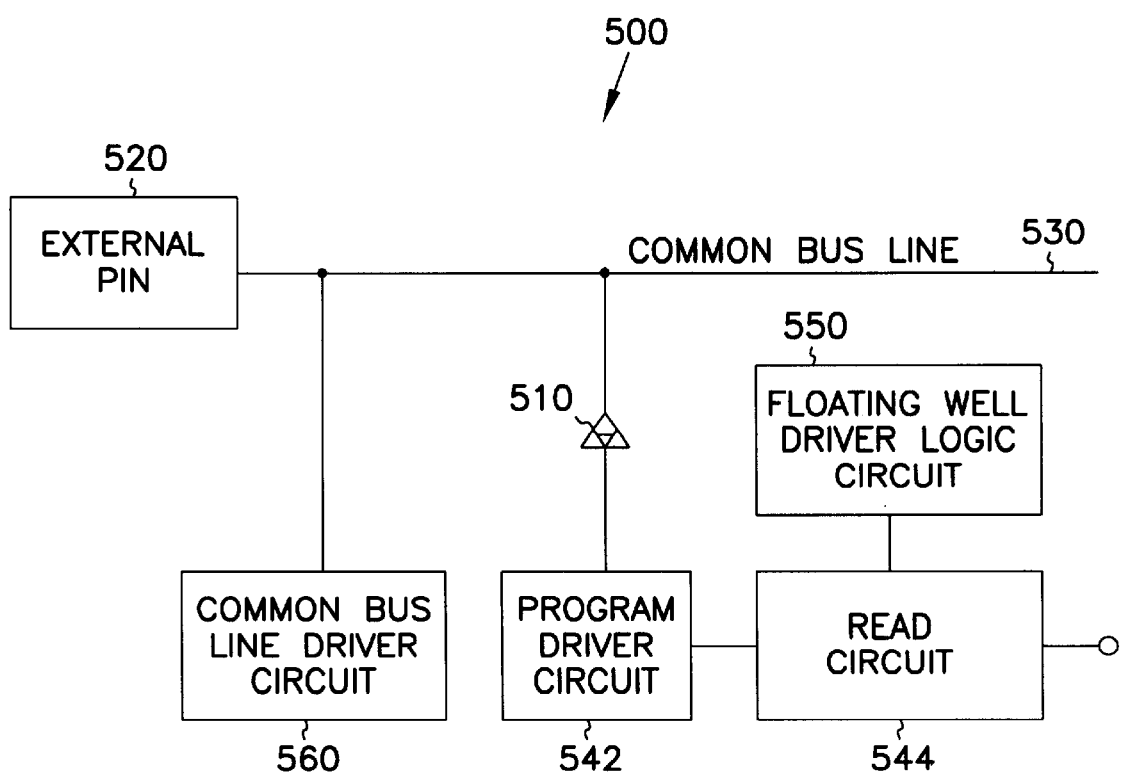
FIG. 5 is a block diagram of support circuits for antifuses according to an embodiment of the present invention.

Additional support circuits 500 in the programming logic circuit 420 are shown in a block diagram in FIG. 5 according to an embodiment of the present invention. The circuits 500 are for programming and reading the antifuses 410–416 in the bank 400, and are shown for programming and reading a single antifuse 510 for purposes of brevity. Additional, similar circuits may be used to program and read a larger number of antifuses. The antifuse 510 has the structure and operational method of one of the antifuses 100, 140, 150, 200, or 250 described above with reference to FIGS. 1, 1A, 1B, 2, and 2A. The antifuse 510 has a first terminal coupled to an external pin 520 through a common bus line 530, and a second terminal coupled to a program driver circuit 542. The external pin 520 corresponds to the external pin 430 shown in FIG. 4. The program driver circuit 542 is used to select the antifuse 510 to be programmed. A read circuit 544 is coupled to the antifuse 510 through the program driver circuit 542 to read a state of the antifuse 510 during the active and sleep modes, and a floating well driver logic circuit 550 is coupled to the read circuit 544. The antifuse 510 is one of several antifuses in a bank (not shown), and the floating well driver logic circuit 550 is also coupled to a read circuit for each of the other antifuses in the bank. In the programming mode an elevated voltage is applied to the common bus line 530 through the external pin 520 to program the antifuse 510. A common bus line driver circuit 560 is coupled to the common bus line 530 to drive the common bus line 530 to a reference voltage such as Vss when the antifuse 510 is being read by the read circuit 544. In other embodiments of the present invention the floating well driver logic circuit 550 or the common bus line driver circuit 560 may not be needed or included in the circuits 500.

Figure 6:
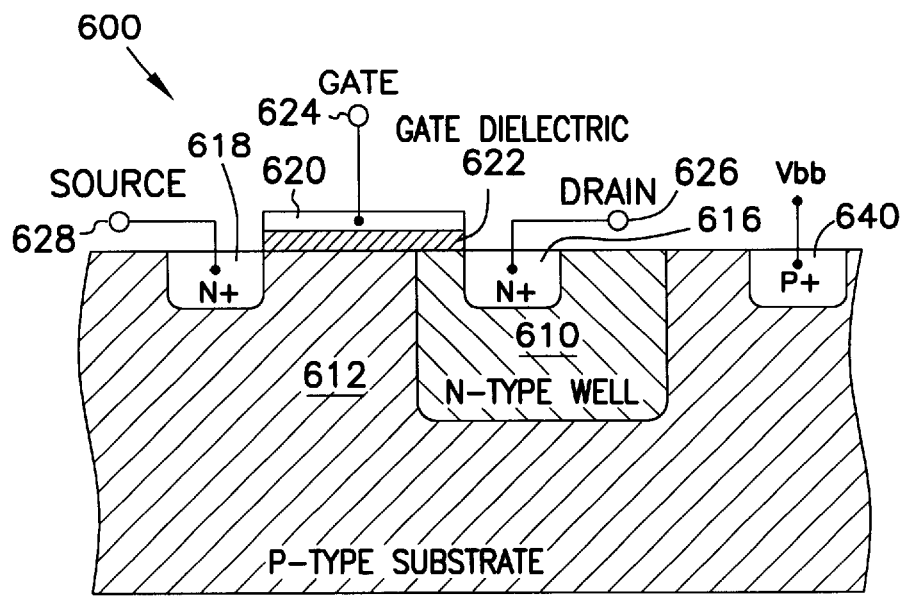
FIG. 6 is a cross-sectional view of a high-voltage transistor according to an embodiment of the present invention.

The common bus line driver circuit 560 and the program driver circuit 542 each include a high-voltage transistor (HVT). One example of such a HVT is an n-well drain transistor 600, a cross-sectional view of which is shown in FIG. 6 according to an embodiment of the present invention. An n-type well 610 is formed in a p-type substrate 612, and an n+-type drain diffusion region 616 is formed in the well 610. An n+-type source diffusion region 618 is formed in the substrate 612. A gate electrode 620 is formed over a layer of gate dielectric 622 which is formed over the substrate 612 between the source and drain diffusion regions 618 and 616. The gate electrode 620 is connected to a gate terminal 624. Likewise, a drain terminal 626 is connected to the n+-type drain diffusion region 616 and a source terminal 628 is connected to the n+-type source diffusion region 618. In alternate embodiments of the present invention the gate electrode 620 comprises metal or polysilicon or layers of polysilicon and a silicide such as tungsten silicide (WSi$_x$), titanium silicide (TiSi$_2$), or cobalt silicide (CoSi$_2$). The gate dielectric 622 may be oxide, oxynitride, or nitrided oxide. A p+-type diffusion region 640 is formed in the substrate 612 to provide an ohmic contact coupling the substrate 612 to Vbb.

The n-well drain transistor 600 has a high drain breakdown voltage. In operation the substrate 612 is coupled to Vbb and the drain terminal 626 is coupled to a line with a high positive voltage, such as the common bus line 530 shown in FIG. 5 during the programming mode. The n-well drain transistor 600 will break down and allow current to flow between the drain terminal 626 and the substrate 612 when a critical electric field intensity (E) is reached across a boundary between the n-type well 610 and the p-type substrate 612. E may be approximated as the voltage drop across the boundary divided by a width of a depletion region at the boundary of the n-type well 610 and the p-type substrate 612. Dopant concentrations in the n-type well 610 and the p-type substrate 612 are relatively low such that the width of the depletion region between the two is relatively large. The boundary will not break down even under a very large voltage drop across the boundary because the E is less than the critical E. As a result, the n-well drain transistor 600 will not break down even if the voltage on the drain terminal 626 is relatively high. In contrast, an ordinary n-channel transistor does not have the n-type well 610, and there is a boundary between a p-type substrate and an n+-type drain diffusion region with a very high dopant concentration. A depletion region at this boundary is not very wide, and as a consequence it will break down under a smaller voltage.

Figure 7:
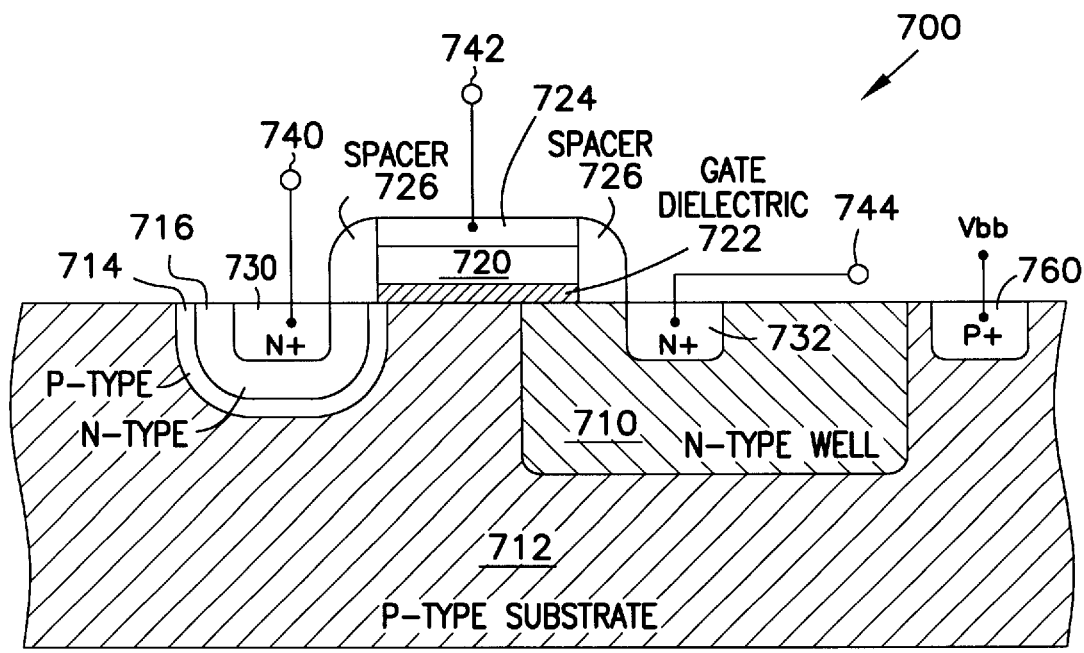
FIG. 7 is a cross-sectional view of a high-voltage transistor according to an embodiment of the present invention.

Other examples of a HVT will now be described. A cross-sectional view of an n-well drain transistor 700 is shown in FIG. 7 according to another embodiment of the present invention. An n-type well 710 is formed in a drain side of a p-type substrate 712, and a p-type halo implant 714 is formed in a source side of the substrate 712. An n-type lightly doped drain (LDD) 716 is implanted inside the halo implant 714. A gate 720 is formed over a layer of gate dielectric 722 which is formed over the substrate 712 between the n-type well 710 and the halo implant 714. An electrode 724 is formed over the gate 720. In alternate embodiments of the present invention gate may comprise polysilicon and the electrode 724 may comprise a silicide such as tungsten silicide (WSi$_x$), titanium silicide (TiSi$_2$), or cobalt silicide (CoSi$_2$). The gate dielectric 722 may be oxide, oxynitride, or nitrided oxide. The gate 720 and the electrode 724 may also comprise metal. One or more spacers 726 are then formed on the sides of the gate dielectric 722, the gate 720, and the electrode 724. An n+-type source diffusion region 730 is implanted inside the LDD 716 and the halo implant 714. Also, an n+-type drain diffusion region 732 is implanted in the n-type well 710. The drain diffusion region 732 is not surrounded by LDD or halo implants which are blocked from the drain side of the substrate 712. A source terminal 740 is connected to the source diffusion region 730, a gate terminal 742 is connected to the electrode 724, and a drain terminal 744 is connected to the drain diffusion region 732. A p+-type diffusion region 760 is formed in the substrate 712 to provide an ohmic contact coupling the substrate 712 to Vbb. The n-well drain transistor 700 has a high drain breakdown voltage for reasons analogous to those recited in the description of the n-well drain transistor 600 shown in FIG. 6.

Figure 8:
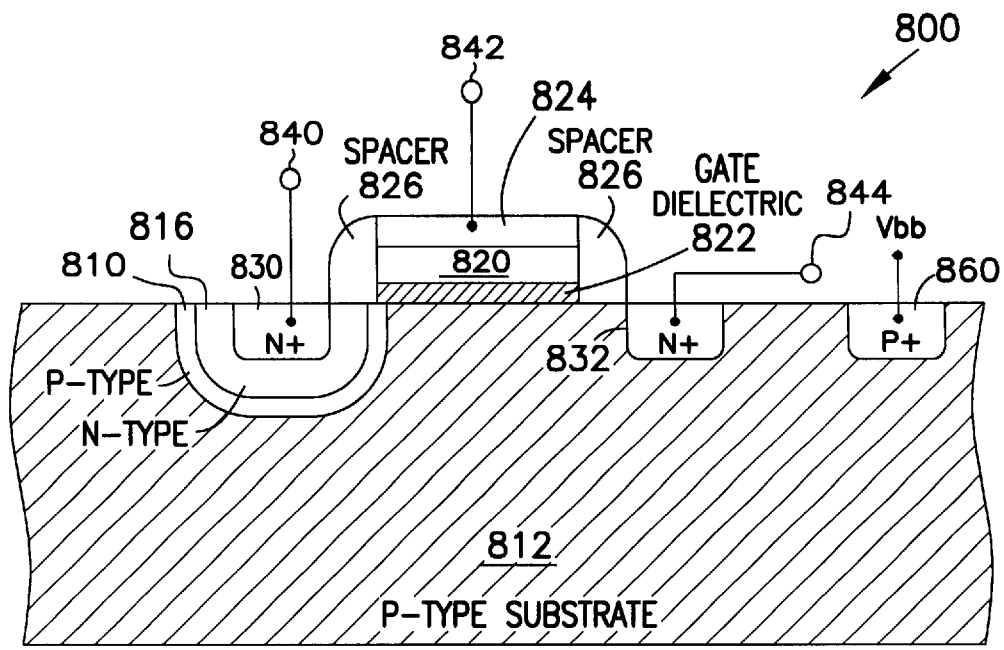
FIG. 8 is a cross-sectional view of a high-voltage transistor according to an embodiment of the present invention.

A cross-sectional view of an n-channel transistor 800 is shown in FIG. 8 which is a HVT according to an embodiment of the present invention. A p-type halo implant 810 is formed in a source side of a p-type substrate 812. An n-type lightly doped drain (LDD) 816 is implanted inside the halo implant 810. A gate 820 is formed over a layer of gate dielectric 822 which is formed over the substrate 812. An electrode 824 is formed over the gate 820. In alternate embodiments of the present invention the gate 820 comprises polysilicon and the electrode 824 may comprise a silicide such as tungsten silicide (WSi$_x$), titanium silicide (TiSi$_2$), or cobalt silicide (CoSi$_2$). The gate 820 and the electrode 824 may comprise metal. The gate dielectric 822 may be oxide, oxynitride, or nitrided oxide. One or more spacers 826 are then formed on the sides of the gate dielectric 822, the gate 820, and the electrode 824. An n+-type source diffusion region 830 is implanted inside the LDD 816 and the halo implant 810. Also, an n+-type drain diffusion region 832 is implanted in the substrate 812. The drain diffusion region 832 is not surrounded by LDD or halo implants which are blocked from a drain side of the substrate 812. A source terminal 840 is connected to the source diffusion region 830, a gate terminal 842 is connected to the electrode 824, and a drain terminal 844 is connected to the drain diffusion region 832. The drain diffusion region 832 and the source diffusion region 830 are self-aligned with the spacers 826. A p+-type diffusion region 860 is formed in the substrate 812 to provide an ohmic contact coupling the substrate 812 to Vbb. The n-channel transistor 800 has a high drain breakdown voltage and may be used in embodiments of the present invention described above in place of the n-well drain transistor 600 shown in FIG. 6.

Figure 8A:
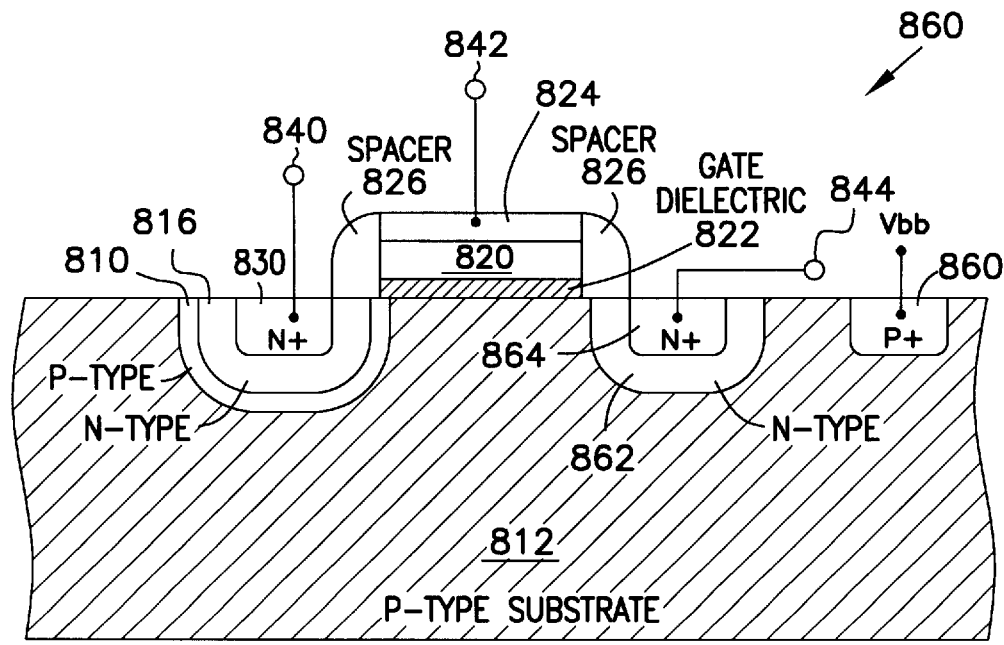
FIG. 8A is a cross-sectional view of a high-voltage transistor according to an embodiment of the present invention.

A cross-sectional view of an n-channel transistor 860 is shown in FIG. 8A which is a HVT according to an embodiment of the present invention. The transistor 860 is similar to the transistor 800 shown in FIG. 8, and similar elements have been given the same reference numerals and will not be further described for purposes of brevity. In addition to the elements of the transistor 800, the LDD implant is not blocked, and an n-type LDD 862 is implanted in a drain side of the p-type substrate 812. An n+-type drain diffusion region 864 is implanted inside the LDD 862 in place of the drain diffusion region 832 of the transistor 800. The transistor 860 functions in a manner similar to the transistor 800.

The transistors 600, 700, 800, and 860 shown in FIGS. 6, 7, 8, and 8A may be fabricated according to process steps used to fabricate field-effect transistors in an integrated circuit, and do not require extra process steps. In another embodiment of the present invention, an added mask and implant could be applied to the drain diffusion region 832 to customize the high drain breakdown voltage of the transistor 800.

Figure 9:
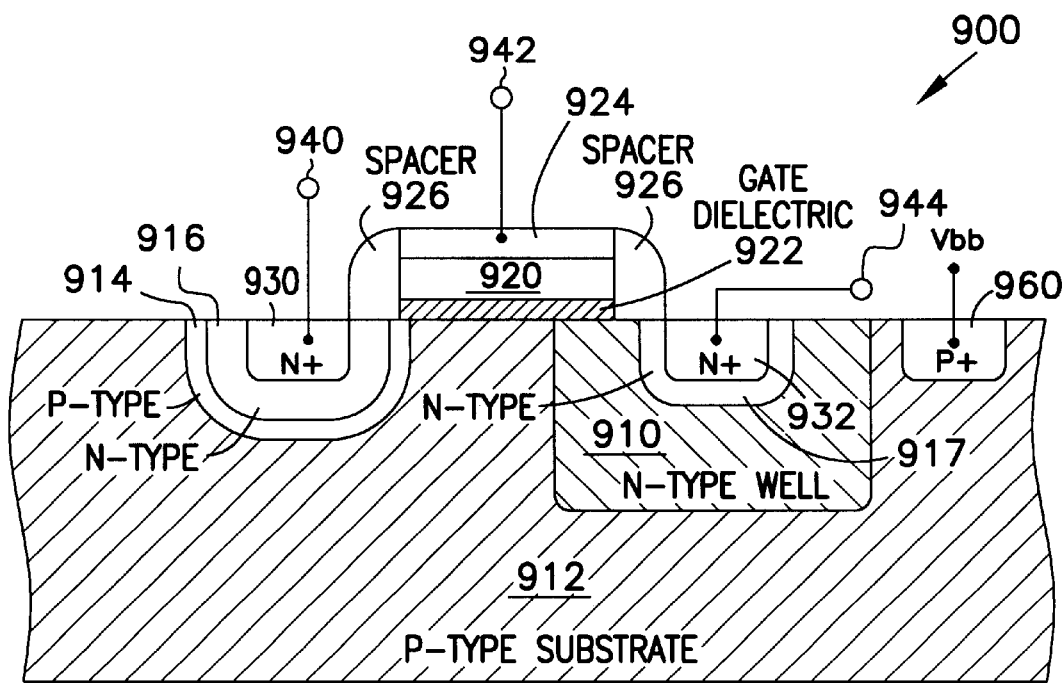
FIG. 9 is a cross-sectional view of a high-voltage transistor according to an embodiment of the present invention.

A cross-sectional view of an n-well drain transistor 900 is shown in FIG. 9 which is a HVT according to another embodiment of the present invention. An n-type well 910 is formed in a drain side of a p-type substrate 912, and a p-type halo implant 914 is formed in a source side of the substrate 912 and blocked from the drain side. Two n-type lightly doped drains (LDD) 916 and 917 are implanted inside the halo implant 914 and the n-type well 910. A gate 920 is formed over a layer of gate dielectric 922 which is formed over the substrate 912 between the n-type well 910 and the halo implant 914. An electrode 924 is formed over the gate 920. In alternate embodiments of the present invention the gate 920 comprises polysilicon and the electrode 924 may comprise a silicide such as tungsten silicide (WSi$_x$), titanium silicide (TiSi$_2$), or cobalt silicide (CoSi$_2$). The gate dielectric 922 may be oxide, oxynitride, or nitrided oxide. The gate 920 and the electrode 924 may comprise metal. One or more spacers 926 are then formed on the sides of the gate dielectric 922, the gate 920, and the electrode 924. An n+-type source diffusion region 930 is implanted inside the LDD 916 and the halo implant 914. Also, an n+-type drain diffusion region 932 is implanted in the LDD 917 and the n-type well 910. The drain diffusion region 932 in the LDD 917 is not surrounded by a halo implant which was blocked. A source terminal 940 is connected to the source diffusion region 930, a gate terminal 942 is connected to the electrode 924, and a drain terminal 944 is connected to the drain diffusion region 932. The drain diffusion region 932 and the source diffusion region 930 are self-aligned with the spacers 926. A p+-type diffusion region 960 is formed in the substrate 912 to provide an ohmic contact coupling the substrate 912 to Vbb. The n-well drain transistor 900 has a high drain breakdown voltage for reasons analogous to those recited in the description of the n-well drain transistor 600 shown in FIG. 6.

Figure 10:
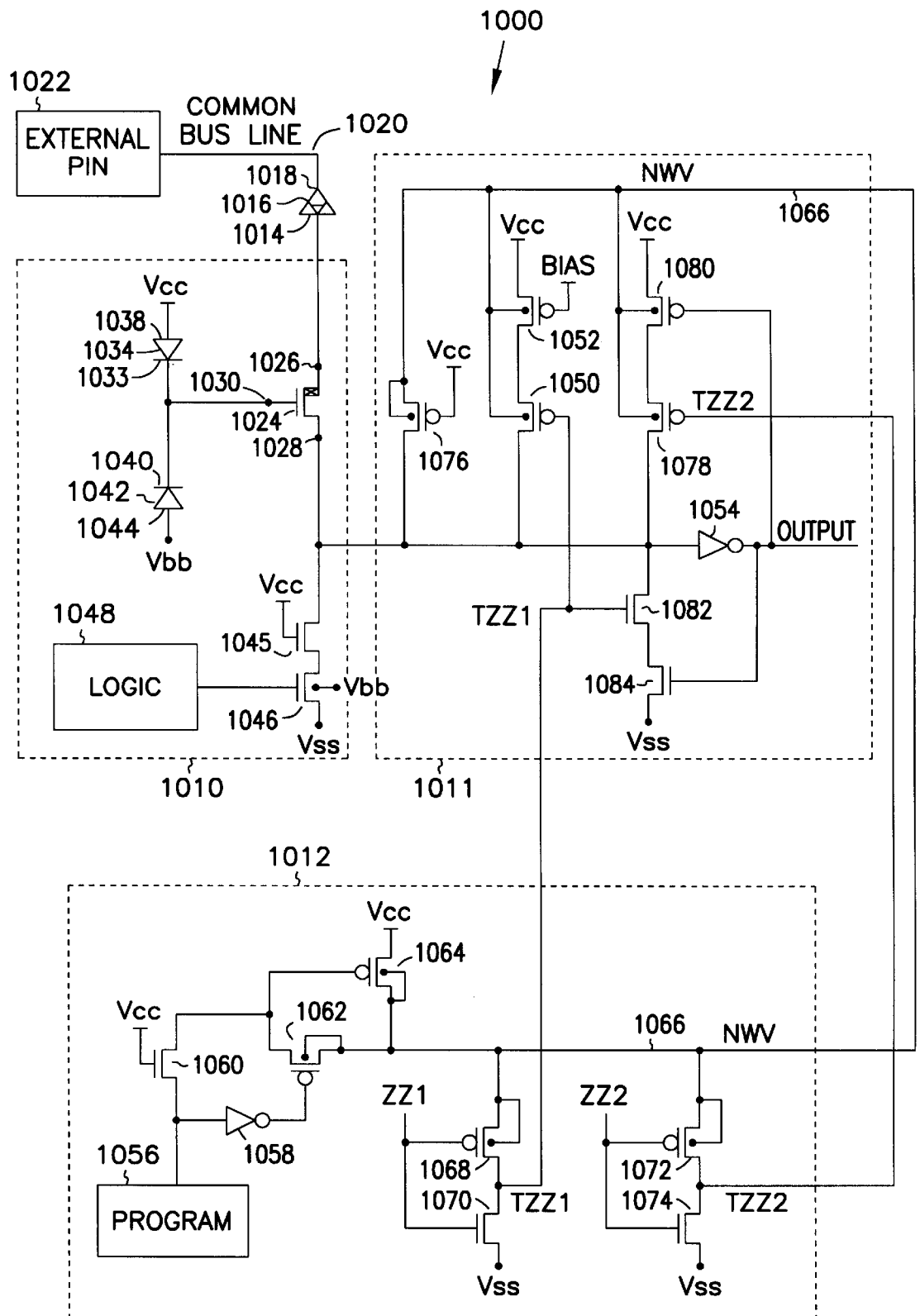
FIG. 10 is an electrical schematic diagram of support circuits for antifuses according to an embodiment of the present invention.

Several of the circuits 500 shown in FIG. 5 are shown in greater detail in FIG. 10. An electrical schematic diagram of several support circuits 1000 for programming and reading antifuses is shown in FIG. 10 according to an embodiment of the present invention. The circuits 1000 are located in the programming logic circuit 420 shown in FIG. 4, and include a program driver circuit 1010, a read circuit 1011, and a floating well driver logic circuit 1012. The program driver circuit 1010 is coupled to a gate electrode 1014 of an antifuse 1016, and a well 1018 of the antifuse 1016 is coupled through a common bus line 1020 to an external pin 1022. The antifuse 1016 is similar in structure and operation to the antifuse 100 shown in FIG. 1.

The program driver circuit 1010 includes a HVT 1024 having a drain terminal 1026, a source terminal 1028, and a gate terminal 1030. The HVT 1024 is similar in structure and operating characteristics to the n-well drain transistor 600 shown in FIG. 6. The drain terminal 1026 is coupled to the gate electrode 1014 of the antifuse 1016. The gate terminal 1030 is coupled to a cathode 1033 of a diode 1034, and an anode 1038 of the diode 1034 is coupled to Vcc. The diode 1034 is forward biased as long as Vcc exceeds a voltage at the gate terminal 1030. The gate terminal 1030 is coupled to a cathode 1040 of a diode 1042. An anode 1044 of the diode 1042 is coupled to Vbb. The diodes 1034 and 1042 maintain the gate terminal 1030 at a voltage slightly less than Vcc, or higher. Current will flow through the HVT 1024 as long as the other elements of the circuits 1000 allow current to flow, as will be described hereinbelow.

The program driver circuit 1010 also includes a first n-channel transistor 1045 and a second n-channel transistor 1046 coupled in cascode between the source terminal 1028 and Vss. A gate terminal of the transistor 1045 is coupled to Vcc, and the transistor 1045 is switched on as long as Vcc exceeds a voltage at its source terminal by a threshold voltage $V_T$ of the transistor 1045. A gate terminal of the transistor 1046 is coupled to a logic circuit 1048 which controls the program driver circuit 1010 during the programming, active, and sleep modes. A body terminal of the transistor 1046 is coupled to Vbb.

The transistor 1046 is switched off by the logic circuit 1048 in each of the programming, active, and sleep modes, and is switched on for a short period to program the antifuse 1016 in the programming mode. In the active mode, current may flow from the read circuit 1011 through the HVT 1024 and the antifuse 1016 to the common bus line 1020. A more detailed description of the active mode is recited below. No substantial current passes through the transistors 1045 and 1046 in the active mode or in the sleep mode which will also be described below.

The common bus line 1020 is coupled to receive an elevated voltage in the programming mode, for example 15 volts, through the external pin 1022. Before it is programmed the elevated voltage on the common bus line 1020 is distributed across the antifuse 1016, the transistors 1024, 1045, and 1046, and the diodes 1034 and 1042 which are non-linear elements. The distribution of the elevated voltage is non-linear and may vary over time. Once the antifuse 1016 is programmed it is an impedance element and the distribution of the elevated voltage changes. The transistor 1046 is switched off and no current path exists through the read circuit 1011 in the programming mode so no substantial current passes through the HVT 1024. Voltages along the program driver circuit 1010 rise as a result, and the elevated voltage is distributed across the transistors 1024, 1045, and 1046 and the diodes 1034 and 1042 in a manner described hereinbelow.

The antifuse 1016 may be selected to be programmed by the logic circuit 1048 by switching on the transistor 1046 and conduct current from the common bus line 1020 through to Vss. The transistor 1046 is switched on for a short period of time to allow the elevated voltage on the common bus line 1020 to rupture a gate dielectric in the antifuse 1016, and is then switched off.

The two transistors 1045 and 1046 are coupled in cascode to substantially prevent the occurrence of a snap-back condition when the transistor 1046 is switched off. Snap-back occurs when there is current flowing between a source terminal and a drain terminal of a transistor that cannot be shut off by a voltage at a gate terminal of the transistor. Snap-back may start if the transistor is switched on by a high voltage at the gate terminal, a voltage at the drain terminal is very high, and a substantial current is passing through the transistor. If the voltage at the gate terminal is reduced to a low voltage the transistor may not switch off if the voltage at the drain terminal is too high and there is too much current conducting through the transistor. Snap-back may occur in the transistor 1046 as the antifuse 1016 is programmed and the logic circuit 1048 attempts to switch off the transistor 1046 with a low voltage on its gate terminal. The elevated voltage on the common bus line 1020 and the current passing through the antifuse 1016 may be high enough to cause snap-back in the transistor 1046.

One way of reducing snap back is to lower the voltage on the common bus line 1020 after an antifuse is programmed. This method substantially slows the programming of a sequence of antifuses because the voltage must be lowered after each antifuse is programmed. In the program driver circuit 1010, snap-back is substantially prevented in the transistor 1046 by the transistor 1045 which is placed to reduce the voltage on the drain terminal of the transistor 1046. The transistor 1045 reduces the voltage on the drain terminal of the transistor 1046 to approximately Vcc less a threshold voltage of the transistor 1045, which is enough to substantially prevent snap-back. The transistors 1045 and 1046 comprise a cascode configuration.

The transistor 1045 is also employed to reduce current leakage through the antifuse 1016. If the antifuse 1016 is unprogrammed, any current leakage through it will degrade its gate dielectric. It is therefore advantageous to reduce sources of current leakage in the program driver circuit 1010 as much as possible.

One source of current leakage in the program driver circuit 1010 is the transistor 1046. Current may leak through the transistor 1046 due to drain induced barrier lowering (DIBL). The transistor 1046 is an n-channel transistor and is switched on to conduct current between its drain and source terminals when the voltage at its gate terminal exceeds the voltage at its source terminal by a threshold voltage $V_T$ of the transistor 1046. The difference between the voltage at the gate terminal and the voltage at the source terminal is called $V_{GS}$. DIBL leakage current flows between the drain terminal and the source terminal at a subthreshold $V_{GS}$, when $V_{GS}$ is less than $V_T$ of the transistor 1046. DIBL leakage current therefore occurs when the transistor 1046 is switched off, and this current can damage the antifuse 1016 when it is unprogrammed. The subthreshold $V_{GS}$ is lowered as the voltage at the drain terminal of the transistor 1046 increases, and the DIBL leakage current will therefore occur at lower and lower values of $V_{GS}$. If the voltage at the drain terminal is high enough, DIBL leakage current will occur when $V_{GS}$ is zero. The transistor 1045 reduces DIBL leakage current by reducing the voltage at the drain terminal of the transistor 1046, and therefore reduces leakage current through the antifuse 1016.

Current may also leak through the transistor 1046 due to gate induced drain leakage (GIDL). The transistor 1046 is similar to a conventional n-channel transistor and has n+-type source and drain regions separated by a channel region in a p-type substrate that is coupled to Vbb. A thin layer of oxide separates the channel region from a gate electrode. The source and drain regions and the gate electrode are connected to the corresponding terminals described above, the n+-type drain region being coupled to the transistor 1045. The n+-type drain region and the p-type substrate comprise a parasitic diode which is reverse biased with a positive voltage on the drain terminal of the transistor 1046. GIDL current leaks across the reverse biased parasitic diode, and increases with an increase of an electric field intensity (E) near the drain region which is increased due to the proximity of the gate electrode. GIDL current increases with a rising voltage on the drain terminal of the transistor 1046 which raises E near the drain region. The transistor 1045 reduces GIDL current by reducing the voltage at the drain terminal of the transistor 1046, and therefore reduces leakage current through the antifuse 1016.

Snap-back and the DIBL and GIDL leakage current described above may be substantially prevented without the use of the transistor 1045 according to alternate embodiments of the present invention. In an alternate embodiment of the present invention, the cascode configuration of the transistors 1045 and 1046 is replaced by the single transistor 1046.

For example, DIBL leakage current may flow in the transistor 1046 even if the voltage at its drain terminal is not elevated due to process conditions in which the transistor 1046 is fabricated. A method that may be used to reduce DIBL leakage current is to adjust an implant for the transistor 1046, or to add a masked implant step to raise the threshold voltage of the transistor 1046. Another method is to lower Vbb, the voltage coupled to the body terminal of the transistor 1046, to raise its threshold voltage. These methods may be used if the transistor 1046 is employed alone or as part of the cascode configuration with the transistor 1045.

The read circuit 1011 includes elements used to read a state of the antifuse 1016, and these elements will now be described. The read circuit 1011 includes a first p-channel transistor 1050 and a second p-channel transistor 1052. The transistor 1052 is switched on by a bias voltage BIAS applied to its gate terminal, and its source terminal is coupled to Vcc. The voltage BIAS is generated by a current mirror (not shown) and is approximately equal to Vcc less an amount selected to control current through the transistor 1052. A drain terminal of the transistor 1052 is coupled to a source terminal of the transistor 1050, and the drain terminal of the transistor 1050 is coupled to the source terminal 1028 of the HVT 1024. The gate terminal of the transistor 1050 is coupled to a signal TZZ1 which is low when the programming logic circuit 420 is in the active mode to read the antifuse 1016 as will be described hereinbelow. The transistor 1050 is therefore switched on to read the antifuse 1016. An inverter 1054 is coupled to the source terminal 1028 and generates an output signal OUTPUT at an output indicating the state of the antifuse 1016.

When the antifuse 1016 is read the common bus line 1020 is coupled to Vss and the impedance of the antifuse 1016 is compared with the impedance of the transistor 1052 that is switched on by the voltage BIAS. The transistor 1052 may be replaced by a resistor or other load device in alternate embodiments of the present invention. The transistor 1050 is switched on to create a current path from Vcc through the transistors 1052, 1050, 1024, and the antifuse 1016 to the common bus line 1020. If the antifuse is programmed and has a low impedance a very low voltage will occur at the source terminal 1028 that is inverted by the inverter 1054 into a high OUTPUT signal indicating the antifuse 1016 is programmed. If the antifuse 1016 is unprogrammed it will have a very high impedance and the voltage at the source terminal 1028 will be close to Vcc. The inverter 1054 will invert this high voltage into a low OUTPUT signal indicating that the antifuse 1016 is unprogrammed.

With reference to the bank 400 shown in FIG. 4, once one of the antifuses 410–416 in the bank 400 is programmed, it is an impedance element similar to a diode or a resistor, and provides a possible current path for current on the common bus line 442. It is desirable to limit current on the common bus line 442, and therefore additional sources of current on the common bus line 442 are to be substantially eliminated as far as is possible. For this reason, the circuits 1000 include several features to substantially eliminate current flow from the common bus line 1020 through the antifuse 1016, and these features will now be described.

The HVT 1024 is a possible source of current flow from the common bus line 1020 during the programming mode when the common bus line 1020 is at the elevated voltage and the antifuse 1016 is programmed. The elevated voltage may induce breakdown current in the HVT 1024, and this does not occur through its substrate because of the high drain breakdown voltage of the HVT 1024. The elevated voltage is distributed across the transistors 1024, 1045, and 1046 and the diodes 1034 and 1042 as described below.

The diode 1034 and the diode 1042 substantially prevent breakdown current across the gate dielectric in the following manner. With reference to both FIGS. 6 and 10, the drain terminal 1026 is connected to the drain diffusion region 616, the gate terminal 1030 is connected to the gate electrode 620, and the source terminal 1028 is connected to the source diffusion region 618. The voltage at the gate electrode 620 is insulated from the voltage at the drain diffusion region 616 by the gate dielectric 622. However, current will flow across the gate dielectric 622 if a voltage differential between the drain diffusion region 616 and the gate electrode 620 is large. The gate dielectric 622 may even break down and become a resistive element if the voltage differential is large enough. The diode 1034 and the diode 1042 hold charge at the gate terminal 1030 such that its voltage rises as current passes across the gate dielectric 622. The diode 1034 allows the voltage at the gate terminal 1030 to rise above Vcc until the voltage difference across the gate dielectric 622 is too small to induce further current flow to the gate electrode 620. The voltage at the gate terminal 1030 will not rise above a breakdown voltage of the diode 1042. The elevated voltage at the drain terminal 1026 is divided into two portions, a first portion held across the gate dielectric 622, and a second portion held across a depletion region in the diode 1042. The coupling of the diode 1034 and the diode 1042 thereby reduces damage to the gate dielectric 622 by bearing a portion of the elevated voltage and reducing the voltage drop across the gate dielectric 622 when the antifuse 1016 is programmed and the common bus line 1020 is at the elevated voltage. If the gate terminal 1030 were held at Vcc then the large voltage differential would cause continuous current and damage the gate dielectric 622 when the drain terminal 1026 was at the elevated voltage.

The structure including the HVT 1024 and the diodes 1034 and 1042 described above give the program driver circuit 1010 the following operating characteristics. Current will flow through the HVT 1024 as long as the antifuse 1016 is programmed and either the transistors 1045 and 1046 or the read circuit 1011 allow current to flow. If current ceases in the HVT 1024 in the active or sleep modes, then the voltage at the source terminal 1028 rises to approximately a voltage at the gate terminal 1030 less a threshold voltage $V_T$ of the HVT 1024. If the elevated voltage is on the common bus line 1020 then a first portion of it is held across the gate dielectric 622, and a second portion of it is held across a depletion region in the diode 1042. This voltage distribution is non-linear, and is determined by the reverse bias characteristics of the diode 1042 and the characteristics of the gate dielectric 622. The voltage distribution may vary over time. The reverse bias characteristics of the diode 1042 may be modified during the operation of the circuits 1000, particularly in the programming mode, by modulating Vbb. For example, Vbb may be tied to Vss, or raised or lowered by 1 or 2 volts from Vss to change the voltage distribution across the gate dielectric 622 and the diode 1042.

Figure 11:
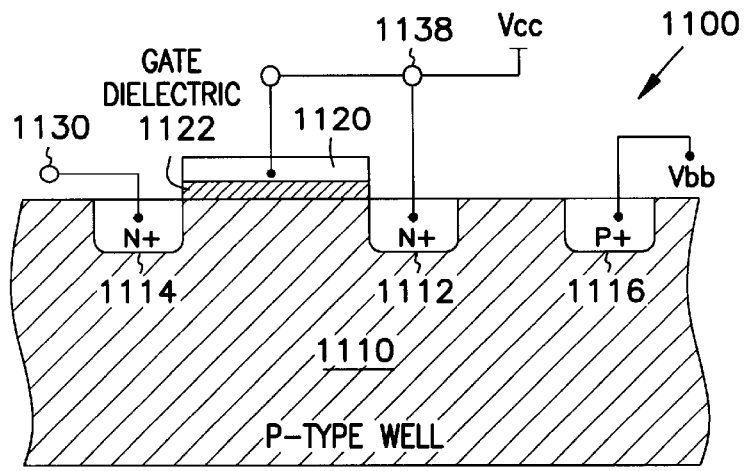
FIG. 11 is a cross-sectional view of an n-channel transistor according to an embodiment of the present invention.

The diodes 1034 and 1042 may be fabricated as a single n-channel transistor 1100 shown in FIG. 11 according to an embodiment of the present invention. The transistor 1100 is formed in a p-type well 1110 in a substrate, a surrounding well, or tank (not shown). The substrate may be a silicon substrate or a semiconductor layer formed over an insulator. An n+-type drain diffusion region 1112 and an n+-type source diffusion region 1114 are formed in the well 1110. A p+-type well tie diffusion region 1116 is also formed in the well 1110 to provide an ohmic contact to bias the well 1110. A gate electrode 1120 is formed over a layer of gate dielectric 1122 which is formed over the well 1110 between the drain diffusion region 1112 and the source diffusion region 1114. In alternate embodiments of the present invention the gate electrode 1120 may be formed by metal or polysilicon or layers of polysilicon and a silicide such as tungsten silicide ($WSi_x$), titanium silicide ($TiSi_2$), or cobalt silicide ($CoSi_2$). The gate dielectric 1122 may be oxide, oxynitride, or nitrided oxide. The gate electrode 1120 and the drain diffusion region 1112 comprise the anode 1038 and are connected to Vcc. The source diffusion region 1114 comprises the cathodes 1033 and 1040 and is connected to the gate terminal 1030. The well 1110 and the diffusion region 1116 comprise the anode 1044 and are coupled to Vbb.

Figure 12:
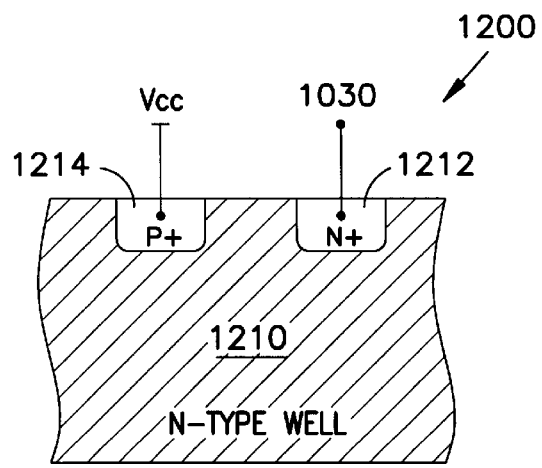
FIG. 12 is a cross-sectional view of a diode according to an embodiment of the present invention.

The diode 1034 may be fabricated as a p+-type diode 1200 shown in FIG. 12 according to an embodiment of the present invention. The diode 1200 is formed in an n-type well 1210 in a substrate, a surrounding well, or tank (not shown). The substrate may be a silicon substrate or a semiconductor layer formed over an insulator. An n+-type diffusion region 1212 and a p+-type diffusion region 1214 are formed in the well 1210. The n+-type diffusion region 1212 comprises the cathode 1033 and is connected to the gate terminal 1030, and the p+-type diffusion region 1214 comprises the anode 1038 and is connected to Vcc.

Figure 13:
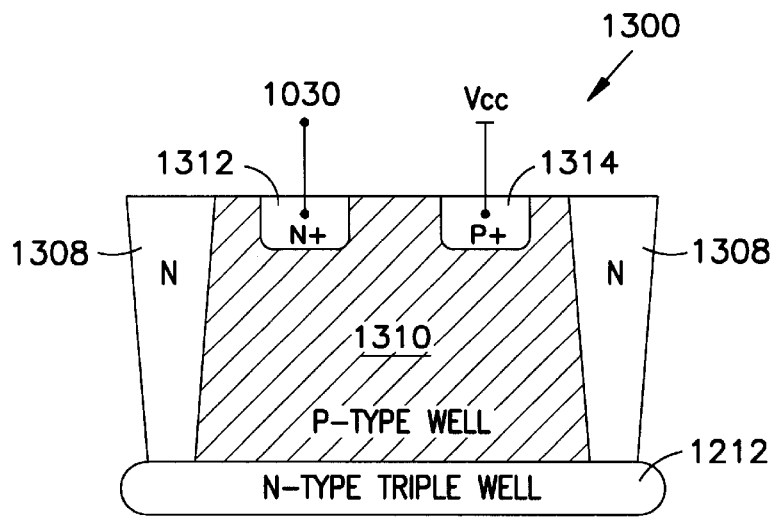
FIG. 13 is a cross-sectional view of a diode according to an embodiment of the present invention.

The diode 1034 may be fabricated as a p-type well diode 1300 shown in FIG. 13 according to an embodiment of the present invention. An n-type triple well 1306 is formed in a substrate, a surrounding well, or tank (not shown). The substrate may be a silicon substrate or a semiconductor layer formed over an insulator. An n-type isolation region 1308 is also formed in the substrate above the triple well 1306. The diode 1300 is formed in a p-type well 1310 formed between the triple well 1306 and the isolation region 1308. An n+-type diffusion region 1312 and a p+-type diffusion region 1314 are formed in the well 1310. The n+-type diffusion region 1312 comprises the cathode 1033 and is connected to the gate terminal 1030, and the p+-type diffusion region 1314 comprises the anode 1038 and is connected to Vcc.

The diode 1042 may be fabricated as the p+-type diode 1200 shown in FIG. 12 according to an embodiment of the present invention. The n+-type diffusion region 1212 comprises the cathode 1040 and is connected to the gate terminal 1030, and the p+-type diffusion region 1214 comprises the anode 1044 and is connected to Vbb instead of Vcc as shown in FIG. 12.

Figure 14:
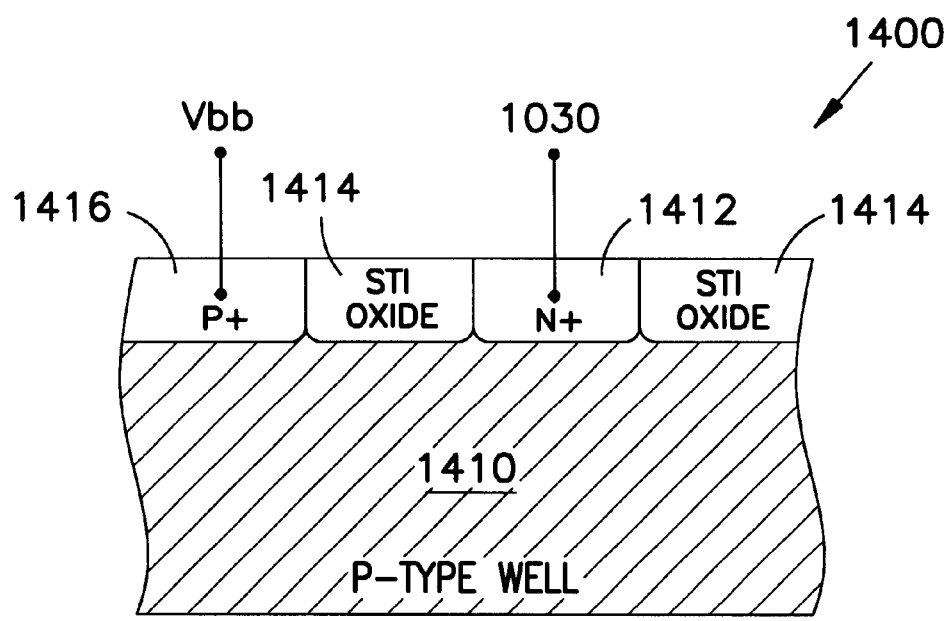
FIG. 14 is a cross-sectional view of a diode according to an embodiment of the present invention.

The diode 1042 may be fabricated as an n+0 diode 1400 shown in FIG. 14 according to an embodiment of the present invention. The diode 1400 is formed in a p-type well 1410 in a substrate, a surrounding well, or tank (not shown). The substrate may be a silicon substrate or a semiconductor layer formed over an insulator. An n+-type diffusion region 1412 is formed in the well 1410 between regions of shallow trench isolation oxide 1414. A p+-type diffusion region 1416 is formed in the well 1410 to provide an ohmic contact coupled to Vbb. The n+-type diffusion region 1412 comprises the cathode 1040 and is connected to the gate terminal 1030, and the p+-type diffusion region 1416 and the well 1410 comprise the anode 1044 coupled to Vbb.

Figure 15:
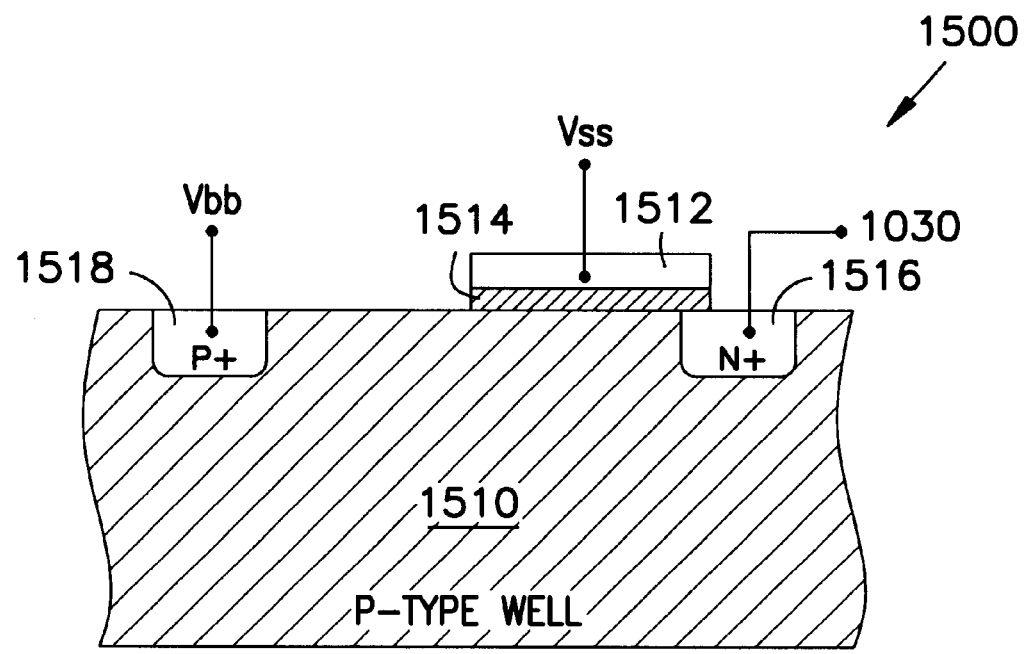
FIG. 15 is a cross-sectional view of a diode according to an embodiment of the present invention.

The diode 1042 may be fabricated as an n+-type gated diode 1500 shown in FIG. 15 according to an embodiment of the present invention. The diode 1500 is formed in a p-type well 1510 in a substrate, a surrounding well, or tank (not shown). The substrate may be a silicon substrate or a semiconductor layer formed over an insulator. A gate electrode 1512 is formed over a layer of gate dielectric 1514 which is formed over the well 1510. The gate electrode 1512 is connected to Vss. In alternate embodiments of the present invention the gate electrode 1512 may comprise metal or polysilicon or layers of polysilicon and a silicide such as tungsten silicide (WSi$_x$), titanium silicide (TiSi$_2$), or cobalt silicide (CoSi$_2$). The gate dielectric 1514 may be oxide, oxynitride, or nitrided oxide. An n+-type diffusion region 1516 is formed in the well 1510 to comprise the cathode 1040 of the diode 1042, and is connected to the gate terminal 1030. A p+-type diffusion region 1518 is formed in the well 1510 to provide an ohmic contact comprising the anode 1044 of the diode 1042 coupled to Vbb. The gate dielectric 1514 is formed near the region 1516 and the gate electrode 1512 modulates the performance of the diode 1042 with a strong electric field.

Figure 16:
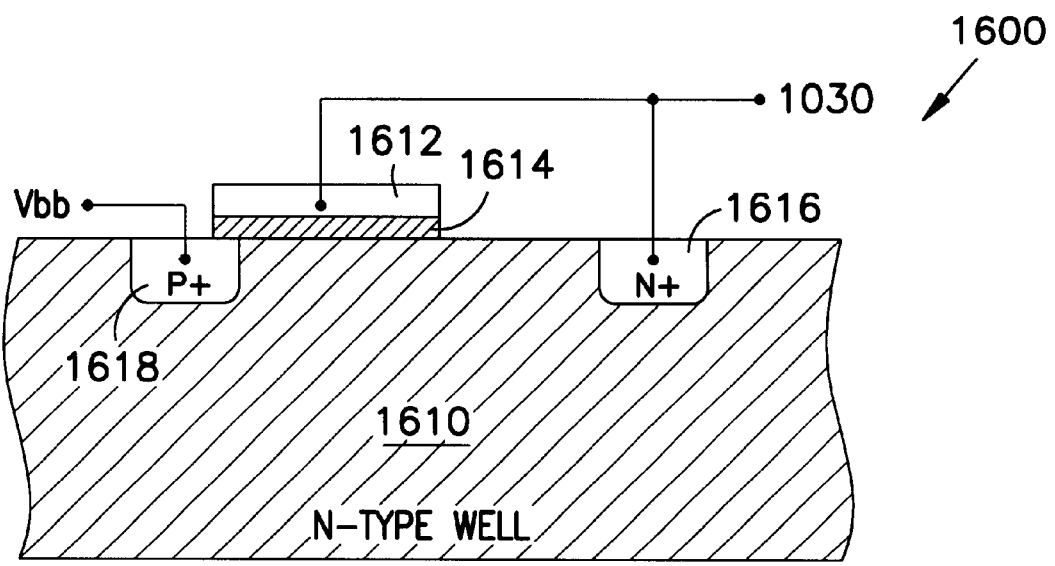
FIG. 16 is a cross-sectional view of a diode according to an embodiment of the present invention.

The diode 1042 may be fabricated as a p+-type gated diode 1600 shown in FIG. 16 according to an embodiment of the present invention. The diode 1600 is formed in an n-type well 1610 in a substrate, a surrounding well, or tank (not shown). The substrate may be a silicon substrate or a semiconductor layer formed over an insulator. A gate electrode 1612 is formed over a layer of gate dielectric 1614 which is formed over the well 1610. In alternate embodiments of the present invention the gate electrode 1612 comprises metal or polysilicon or layers of polysilicon and a silicide such as tungsten silicide (WSi$_x$), titanium silicide (TiSi$_2$), or cobalt silicide (CoSi$_2$). The gate dielectric 1614 may be oxide, oxynitride, or nitrided oxide. An n+-type diffusion region 1616 is formed in the well 1610 to comprise the cathode 1040 of the diode 1042, and is connected to the gate electrode 1612 and to the gate terminal 1030. A p+-type diffusion region 1618 is formed in the well 1610 to comprise the anode 1044 of the diode 1042 coupled to Vbb. The gate dielectric 1614 is formed near the region 1618 and the gate electrode 1612 modulates the performance of the diode 1042 with a strong electric field.

The diodes 1034 and 1042 described above with reference to FIGS. 12–16 may be modified by adding or subtracting implants and mask steps to change their reverse bias characteristics.

Figure 17:
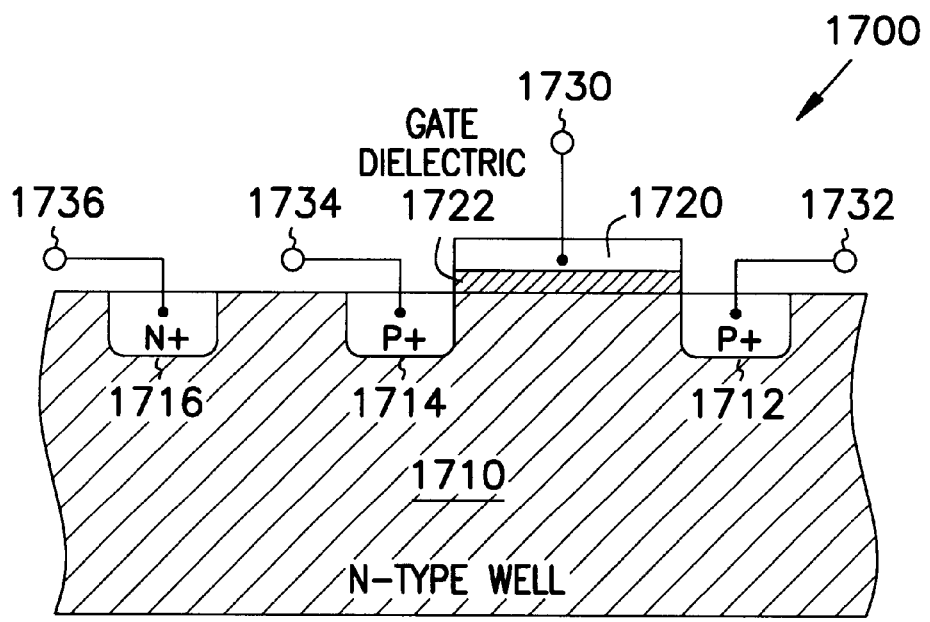
FIG. 17 is a cross-sectional view of a p-channel transistor according to an embodiment of the present invention.

The read circuit 1011 also includes elements that are possible sources of current flow from the common bus line 1020. The read circuit 1011 has several p-channel transistors which are favored over n-channel transistors because p-channel transistors provide a better noise margin by not sustaining a threshold voltage drop from Vcc when the antifuse 1016 is read as described above. However, when the programming logic circuit 420 is in the programming mode and there is an elevated voltage on the common bus line 1020, the p-channel transistors provide a path for current from the common bus line 1020. This will be described with reference to a cross-sectional view of a p-channel transistor 1700 shown in FIG. 17 according to an embodiment of the present invention. The transistors 1050 and 1052 are similar to the p-channel transistor 1700.

The p-channel transistor 1700 is formed in an n-type well 1710 in a substrate, a surrounding well, or a tank (not shown). The substrate may be a silicon substrate or a semiconductor layer formed over an insulator. A p+-type source diffusion region 1712 and a p+-type drain diffusion region 1714 are formed in the well 1710. An n+-type well tie diffusion region 1716 is also formed in the well 1710 to provide an ohmic contact to bias the well 1710 with a reference voltage. A gate electrode 1720 is formed over a layer of gate dielectric 1722 which is formed over the well 1710 between the source diffusion region 1712 and the drain diffusion region 1714. In alternate embodiments of the present invention the gate electrode 1720 may comprise metal or polysilicon or layers of polysilicon and a silicide such as tungsten silicide (WSi$_x$), titanium silicide (TiSi$_2$), or cobalt silicide (CoSi$_2$). The gate dielectric 1722 may be oxide, oxynitride, or nitrided oxide. The gate electrode 1720 is connected to a gate terminal 1730. A source terminal 1732 is connected to the source diffusion region 1712, and a drain terminal 1734 is connected to the drain diffusion region 1714. Finally, a reference terminal 1736 is connected to the well tie diffusion region 1716.

As an example for illustrative purposes only, if the p-channel transistor 1700 is connected in the read circuit 1011 in a manner similar to the transistor 1050, and if both the gate terminal 1730 and the reference terminal 1736 are coupled to Vcc during the programming mode, then unwanted current may flow in the transistor 1700 for the following reasons. According to the example, the drain terminal 1734 is coupled to the source terminal 1028 of the HVT 1024. If the antifuse 1016 is programmed and the elevated voltage is on the common bus line 1020 in the programming mode, a voltage at the source terminal 1028 will rise. With the gate terminal 1730 and the reference terminal 1736 are both coupled to Vcc, the p-channel transistor 1700 may be switched on because the voltage of the drain terminal 1734 rises substantially above Vcc at the gate terminal 1730. As a result, device current will pass between the source terminal 1732 and the drain terminal 1734 to Vcc. In addition, current may be induced through a parasitic diode comprising the drain diffusion region 1714 and the well 1710 coupled to Vcc through the well tie diffusion region 1716. This current is substantially eliminated by the logic circuit 1012.

The logic circuit 1012 switches off p-channel transistors in the read circuit 1011 when the programming logic circuit 420 is in the programming mode and an elevated voltage is on the common bus line 1020. The logic circuit 1012 switches off the p-channel transistors by raising the voltage potential of the wells 1710 by coupling them to an n-well voltage (NWV). The NWV rises as the voltage at the source terminal 1028 rises. As a result, the p-channel transistors are not switched on and no current flows through the parasitic diode in each p-channel transistor. This reduces current flow from the common bus line 1020 through the HVT 1024 and the read circuit 1011 to Vcc in the programming mode. The structure and operation of the logic circuit 1012 will now be described.

The logic circuit 1012 is coupled to receive three signals labeled PROGRAM, ZZ1, and ZZ2, which select one of the programming mode, the active mode, and the sleep mode.

The signals PROGRAM, ZZ1, and ZZ2 are defined in Table 1:

TABLE 1

| MODE | PROGRAM | ZZ1 | ZZ2 |
|---|---|---|---|
| PROGRAMMING | HIGH | LOW | LOW |
| ACTIVE | LOW | HIGH | LOW |
| SLEEP | LOW | LOW | HIGH |

The signals PROGRAM, ZZ1, and ZZ2 can be generated by any appropriate circuit known to those skilled in the art to indicate the mode of operation of the programming logic circuit 420.

When the programming logic circuit 420 is in the active mode the common bus line 1020 is coupled to Vss, and the state of the antifuse 1016 is read as the transistors 1050 and 1052 are switched on and the OUTPUT signal is generated by the inverter 1054. A substantial amount of current is dissipated through the common bus line 1020 during the active mode if the antifuse 1016 is programmed.

The transistor 1052 is switched on by the voltage BIAS, and the transistor 1050 is switched on in the following manner. The PROGRAM signal is low, the signal ZZ1 is high and the signal ZZ2 is low in the active mode. The low PROGRAM signal is provided from a circuit 1056 to force NWV to Vcc as it is coupled to an input of a first inverter 1058 and a source of an n-channel transistor 1060. An output of the inverter 1058 generates a high signal that is coupled to a gate terminal of a p-channel transistor 1062 to switch it off. A gate terminal of the transistor 1060 is coupled to Vcc such that the transistor 1060 is rendered conductive, and the low PROGRAM signal is coupled through the transistor 1060 to switch on a p-channel transistor 1064 at its gate terminal and couple Vcc to an NWV line 1066 that is coupled to the well tie diffusion region 1716 in each p-channel transistor in the read circuit 1011. In the active mode, the NWV is approximately Vcc. The NWV line 1066 thereby couples the NWV to the wells 1710 of p-channel transistors in the read circuit 1011.

The logic circuit 1012 includes a second inverter comprising a p-channel transistor 1068, an n-channel transistor 1070, and a terminal between the two to generate a signal TZZ1. A gate terminal of each of the transistors 1068 and 1070 is coupled to receive the signal ZZ1 which is high. The transistor 1068 is switched off and the transistor 1070 is switched on to generate a low signal TZZ1 which is coupled to the gate terminal of the transistor 1050 to switch it on.

The logic circuit 1012 also includes a third inverter comprising a p-channel transistor 1072, an n-channel transistor 1074, and a terminal between the two to generate a signal TZZ2. A gate terminal of each of the transistors 1072 and 1074 is coupled to receive the signal ZZ2 which is low. The transistor 1072 is switched on and the transistor 1074 is switched off to generate the signal TZZ2 to be high, or approximately Vcc. The high signal TZZ2 is coupled to the read circuit 1011 as will now be described.

In addition to the elements described above, the read circuit 1011 includes a third p-channel transistor 1076, a fourth p-channel transistor 1078, and a fifth p-channel transistor 1080. Each of the transistors 1076, 1078, and 1080 is similar to the p-channel transistor 1700 shown in FIG. 17. The gate terminal of the transistor 1076 is coupled to Vcc, and its reference terminal is coupled to its drain terminal and the NWV line 1066. The transistors 1078 and 1080 are coupled in series between Vcc and the inverter 1054. The high signal TZZ2 is coupled to a gate terminal of the transistor 1078 to switch it off so that the transistors 1078 and 1080 to not add to the current used to read the antifuse 1016. Additional features of the read circuit 1011 will be described hereinbelow.

When the programming logic circuit 420 is in the programming mode the common bus line 1020 is coupled to an elevated voltage. If the antifuse 1016 is programmed, it is an impedance element between the elevated voltage and the rest of the elements in the program driver circuit 1010 and the read circuit 1011. The logic circuit 1012 substantially eliminates current flow in the p-channel transistors in the read circuit 1011 in the following manner.

In the programming mode the PROGRAM signal is high and is coupled to a drain of the transistor 1060 to switch it off. Inverter 1058 generates a low signal to switch on the transistor 1062. The NWV on the NWV line 1066 will rise, for reasons described below, and the high NWV is coupled to the gate terminal of the transistor 1064 to switch it off. With the transistors 1060 and 1064 both switched off, the NWV line 1066 is isolated from both the PROGRAM signal and Vcc. The source terminal 1028 may rise above Vcc in the programming mode when the elevated voltage is on the common bus line 1020 and the antifuse 1016 is programmed. When this happens the transistor 1076 will be switched on because its gate terminal is held at Vcc, and the rising voltage at the source terminal 1028 is coupled to the NWV line 1066 to raise the NWV. The NWV line 1066 is coupled to the wells of each of the transistors 1050, 1052, 1076, 1078, and 1080 which comprise a capacitive load that absorbs charge as the NWV rises.

In the programming mode, both of the signals ZZ1 and ZZ2 are low such that the p-channel transistors 1068 and 1072 are switched on and the n-channel transistors 1070 and 1074 are switched off and both of the signals TZZ1 and TZZ2 rise with the NWV. The signal TZZ1 is coupled to a gate terminal of the transistor 1050, and the signal TZZ2 is coupled to a gate terminal of the transistor 1078. The rise in NWV reduces current being passed through the parasitic diodes in the transistors 1050, 1052, 1076, 1078, and 1080 because the wells 1010 of those transistors have nearly the same voltage potential as the source terminal 1028, and there is not enough voltage potential to forward bias the parasitic diodes. In addition, the gate terminals of the transistors 1050 and 1078 are also coupled to the NWV to prevent them from being switched on by the voltage at the source terminal 1028. Substantial device current is thereby reduced in the transistors 1050, 1052, 1078, and 1080. In this manner the floating well driver logic circuit 1012 prevents substantial current in the p-channel transistors 1050, 1052, 1076, 1078, and 1080 in the programming mode when the elevated voltage is on the common bus line 1020 and an antifuse is to be programmed.

The inverter 1054 and the transistors 1078 and 1080 in the read circuit 1011 are part of a latch circuit used to latch a state of the antifuse 1016 when the programming logic circuit 420 is in the sleep mode. The programming logic circuit 420 is receiving power and operating in both the active and sleep modes. However, in the sleep mode the programming logic circuit 420 shuts down some operations to reduce power dissipation. As mentioned above, a substantial amount of current is dissipated through the common bus line 1020 in the active mode if the antifuse 1016 is programmed. This current is substantially eliminated in the sleep mode.

The latch circuit is used in the sleep mode to latch the state of the antifuse 1016 to indicate correctly the state of the antifuse 1016 in the sleep mode. The latch circuit also includes a first n-channel transistor 1082 and a second n-channel transistor 1084. The transistors 1082 and 1084 are similar to n-channel transistors known to those skilled in the art, and will not be shown in more detail for purposes of brevity. A drain terminal of the transistor 1082 is coupled to a drain terminal of the transistor 1078 and an input of the inverter 1054. A gate terminal of the transistor 1082 is coupled with the gate terminal of the transistor 1050 to receive the signal TZZ1 from the logic circuit 1012. A source terminal of the transistor 1082 is coupled to a drain terminal of the transistor 1084, and a source terminal of the transistor 1084 is coupled to Vss. A gate terminal of the transistor 1084 is coupled to the output of the inverter 1054, as is a gate terminal of the transistor 1080. The gate terminal of the transistor 1078 is coupled to receive the signal TZZ2 from the logic circuit 1012.

The latch circuit is disabled in the active mode described above when the signal ZZ1 is high and the signal ZZ2 is low. The resulting signal TZZ1 is low to switch the transistor 1050 on while switching off the transistor 1082. The signal TZZ2 is high to switch off the transistor 1078. Thus no substantial current passes through the transistors 1078 and 1082 while the antifuse 1016 is being read in the active mode.

In the sleep mode the PROGRAM signal is low so that the NWV line 1066 is coupled to Vcc. The signal ZZ1 is low so the signal TZZ1 is high to switch off the transistor 1050 and block current from the transistor 1052. The high signal TZZ1 also enables the transistor 1082 to be switched on depending on a voltage between the transistors 1082 and 1084. The signal ZZ2 is high so the signal TZZ2 is low to enable the transistor 1078 to be switched on depending on a voltage between the transistors 1078 and 1080. The source terminal 1028 will retain its voltage potential, near either Vcc or Vss, after being read in the active mode. If the source terminal 1028 is high, or is close to or above Vcc, the output of the inverter 1054 will be low to switch off the transistor 1084 and enable the transistor 1080 to be switched on. The high voltage on the source terminal 1028 causes the transistors 1078 and 1080 to be switched on to couple the source terminal 1028 to Vcc and latch the output of the inverter 1054 low. If the source terminal 1028 is low the output of the inverter 1054 will be high to switch off the transistor 1080 and enable the transistor 1084 to be switched on. The low voltage at the source terminal 1028 causes the transistors 1082 and 1084 to be switched on to couple the source terminal 1028 to Vss and latch the output of the inverter 1054 high.

The latch including the transistors 1078, 1080, 1082, and 1084, and the inverter 1054, is used to latch a state of the antifuse 1016 only in the sleep mode because the state of the latch is unknown when the programming logic circuit 420 first receives power after being in a power-down mode. The latch will indicate the correct state of the antifuse 1016 only after it has been read in the active mode. One advantage of the sleep mode is that the transistor 1050 is switched off to reduce the dissipation of current from Vcc through the transistors 1052, 1050, 1024, and the antifuse 1016 to the common bus line 1020.

The antifuse 1016 may be read only intermittently during the operation of an integrated circuit and then its state may be latched the rest of the time according to an alternate embodiment of the present invention. In this embodiment of the invention, the state of the antifuse is read as it is in the active mode described above in response to a signal such as a power-up signal or a wake-up signal for the integrated circuit that initiates the read. The power-up or wake-up signal sets TZZ1 low and TZZ2 high for a period of time to read the antifuse 1016 and allow the inverter 1054 to generate a settled OUTPUT signal. As the period of time ends TZZ1 is set high and TZZ2 is set low to latch the state of the antifuse 1016 as described above.

The capacitance of the NWV line 1066 and the wells of the transistors it is coupled to absorbs charge as the NWV rises. The NWV line 1066 is coupled not only to the transistors shown in FIG. 10, but transistors associated with other antifuses in the bank 400. If all of the antifuses in the bank 400 are unprogrammed, then the capacitive load of the NWV line 1066 will be charged from current passed through one or more of them and which will damage the antifuses. One way of preventing this damage is to short at least one antifuse in each bank, such as the antifuse 410 in the bank 400, with metal such that a current path exists to charge the capacitive load of the NWV line 1066 and its transistors. The shorted antifuse may also be used in a test mode.

The transistors 1070, 1074, and 1084 shown in FIG. 10 may each be replaced by an upper transistor and a lower transistor of similar types coupled in cascode to manage high voltages. The upper transistor has a gate terminal coupled to Vcc and the lower transistor has a gate terminal connected in a manner similar to the corresponding original transistor 1070, 1074, and 1084.

Figure 18:
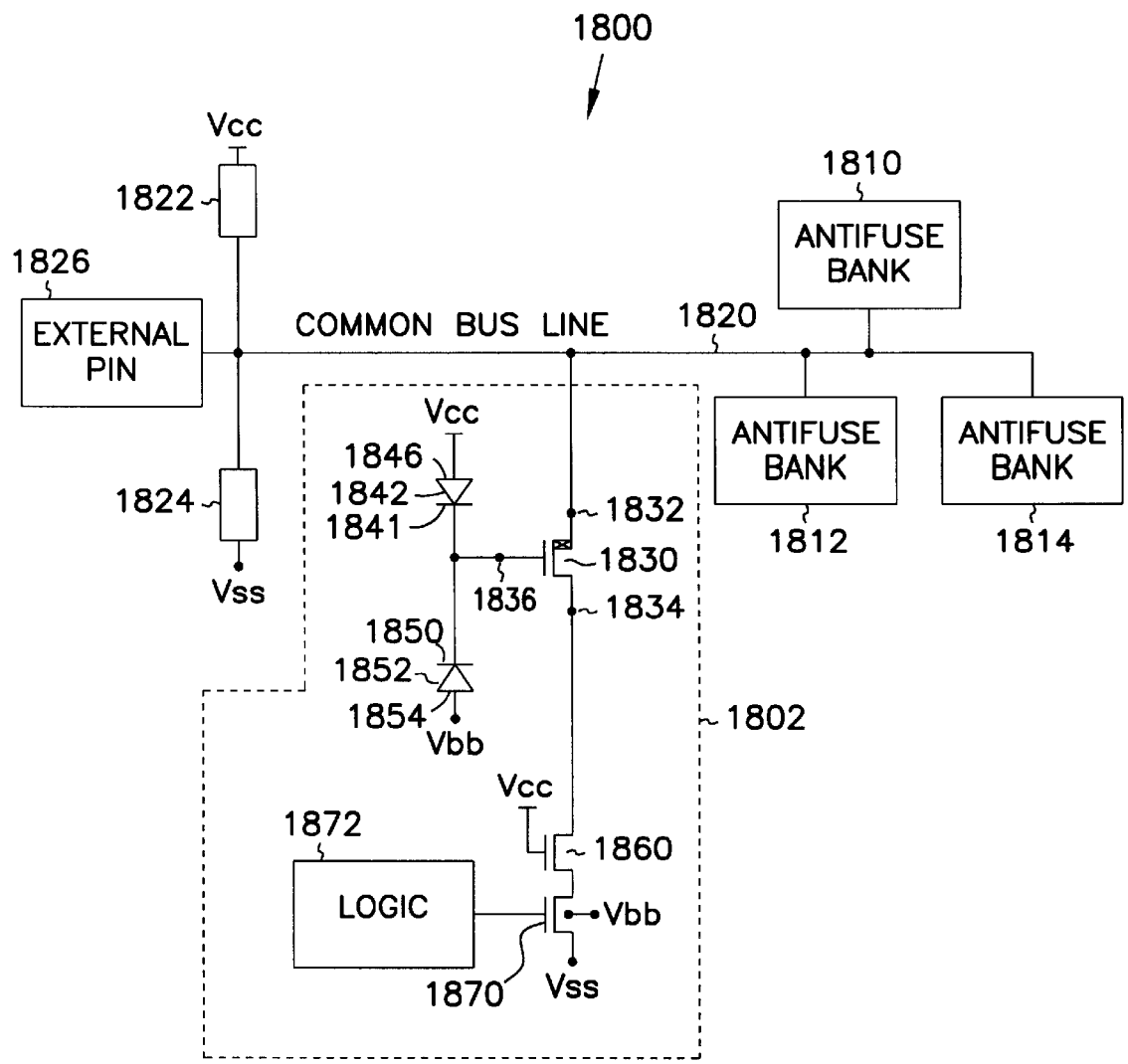
FIG. 18 is an electrical schematic diagram of an integrated circuit with a common bus line driver circuit according to an embodiment of the present invention.

An electrical schematic diagram of an integrated circuit 1800 with a common bus line driver circuit 1802 is shown in FIG. 18 according to an embodiment of the present invention. The integrated circuit 1800 includes three banks 1810, 1812, and 1814 of antifuses coupled to a common bus line 1820. The banks 1810, 1812, and 1814 may be similar to the bank 400 shown in FIG. 4. Integrated circuits according to other embodiments of the present invention may include more or fewer banks of antifuses. The common bus line 1820 is coupled to an ESD device 1822, 1824, and an external pin 1826 of the integrated circuit 1800. The external pin 1826 is similar to the external pin 430 shown in FIG. 4.

The common bus line driver circuit 1802 is coupled to provide a path to Vss for the common bus line 1820. The common bus line driver circuit 1802 includes a HVT 1830 having a drain terminal 1832, a source terminal 1834, and a gate terminal 1836. The HVT 1830 is similar in structure and operating characteristics to the n-well drain transistor 600 shown in FIG. 6. The gate terminal 1836 is coupled to a cathode 1841 of a diode 1842, and an anode 1846 of the diode 1842 is coupled to Vcc. The diode 1842 is forward biased as long as Vcc exceeds a voltage at the gate terminal 1836. The gate terminal 1836 is also coupled to a cathode 1850 of a diode 1852. An anode 1854 of the diode 1852 is coupled to Vbb. The diodes 1842 and 1852 maintain the gate terminal 1836 at a voltage slightly less than Vcc, or higher.

A first n-channel transistor 1860 and a second n-channel transistor 1870 are coupled in cascode between the source terminal 1834 and Vss. A gate terminal of the transistor 1860 is coupled to Vcc, and a gate terminal of the transistor 1870 is coupled to a logic circuit 1872 which controls current in the common bus line driver circuit 1802. A body terminal of the transistor 1870 is coupled to Vbb.

In the active mode the logic circuit 1872 switches on the transistor 1870 such that current on the common bus line 1820 is given a path to Vss. The current flows from the antifuses in the banks 1810, 1812, and 1814 through the HVT 1830 and the transistors 1860, 1870 to Vss as they are read in the active mode according to the description of FIG. 10 recited above. The transistors 1830, 1860, and 1870 are sized to accommodate current from all of these antifuses while maintaining the common bus line 1820 near Vss.

In the programming mode the logic circuit 1872 switches off the transistor 1870 to prevent substantial current flow. This is done to maintain an elevated voltage on the common bus line 1820, and to minimize current flow from the common bus line 1820. Voltages along the common bus line driver circuit 1802 rise when the transistor 1870 is switched off to substantially end current flow, and the voltage rises on the common bus line 1820. The transistor 1830 and the diodes 1842 and 1852 function in a manner similar to the transistor 1024 and the diodes 1034 and 1042 described with reference to FIG. 10.

The program driver circuit 1010 shown in FIG. 10 and the common bus line driver circuit 1802 may be different in alternate embodiments of the present invention. For example, the two circuits 1010 and 1802 may have different HVTs, or one may have a cascode coupling of transistors and the other may have only a single corresponding transistor. The two circuits 1010 and 1802 may also have different combinations of diodes such as those described with reference to FIGS. 11–16.

The logic circuit 1872 may also switch off the transistor 1870 during a test mode to permit an analog characterization of the impedance of each programmed antifuse in the banks 1810, 1812, and 1814. The current/voltage characteristics of each programmed antifuse are tested with a test apparatus such as a curve tracer coupled to the external pin 1826. Current passes through the programmed antifuse, and other current sources coupled to the common bus line 1820 must be substantially blocked during the test mode. Another test mode permits a modulation of the voltage BIAS to modulate the impedance of the transistor 1052. A noise margin for the circuits 1000 may be quantified by determining an impedance of the transistor 1052 at which the inverter 1054 changes the OUTPUT signal. A wider noise margin will allow for more variability in the impedance of the antifuse over the operating lifetime of the circuits 1000 without impairing performance.

In alternate embodiments of the present invention the common bus line driver circuit 1802 is not included in the integrated circuit 1800 because a programming of its antifuses takes place during its manufacture, and the external pin 1826 is coupled to Vss during its operation. This is called supply stealing. The common bus line 1820 is then always coupled to Vss during operation, and the common bus line driver circuit 1802 is not needed.

Figure 19:
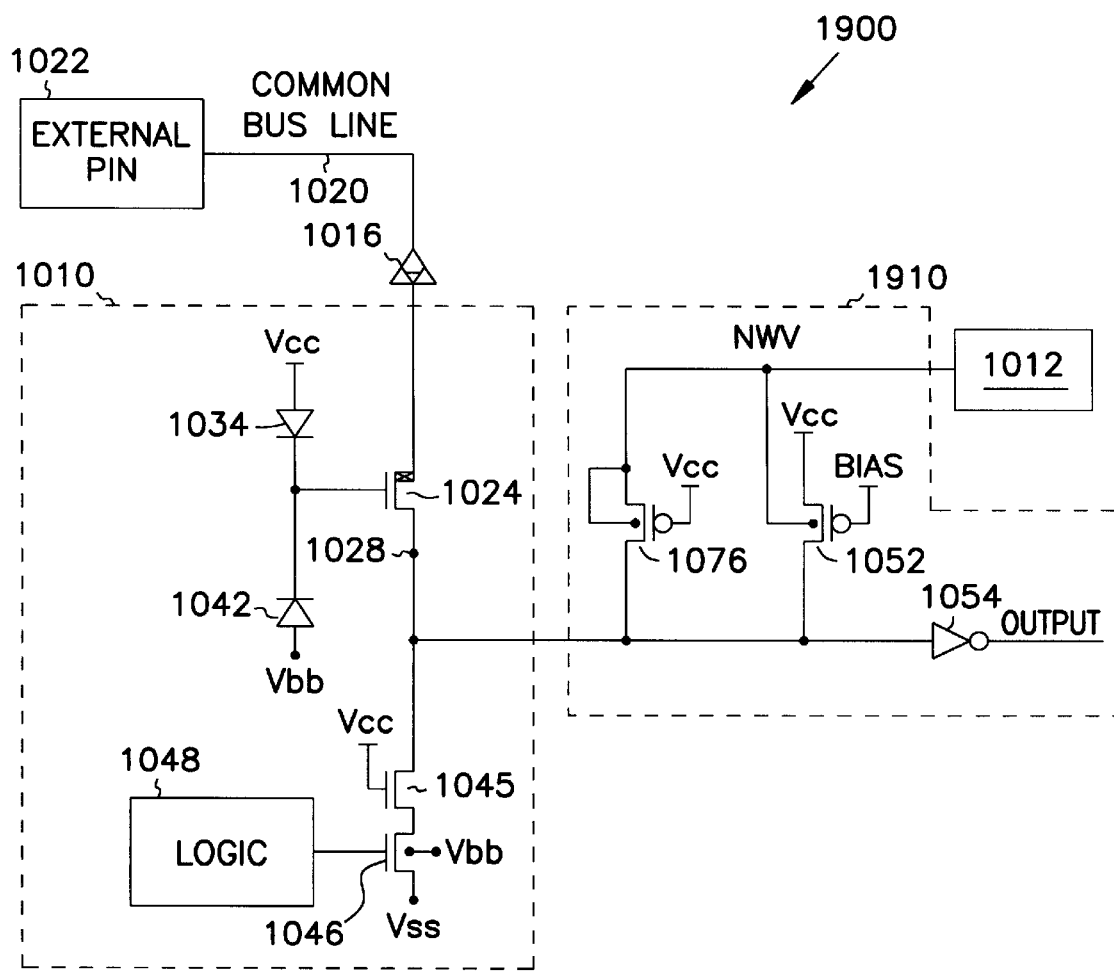
FIG. 19 is an electrical schematic diagram of support circuits for antifuses according to an embodiment of the present invention.

The read circuit 1011 shown in FIG. 10 may be modified to read the antifuse 1016 as it is read in the active mode all of the time. A set of support circuits 1900 including a modified read circuit 1910 are shown in FIG. 19 according to an embodiment of the present invention. All of the other elements of the support circuits 1900 are similar to the support circuits 1000 shown in FIG. 10, have been given the same reference numerals, and will not be further described for purposes of brevity. The state of the antifuse 1016 is never latched by the read circuit 1900.

The read circuit 1910 retains only two of the transistors, 1052 and 1076, from the read circuit 1011, the remaining transistors not being necessary or included in the read circuit 1910. The transistor 1052 may be replaced by a resistor or other load device in alternate embodiments of the present invention. The operation of the transistor 1076 is the same as described above for the read circuit 1011. The antifuse 1016 is read by comparing the impedance of the transistor 1052 with the impedance of the antifuse 1016 with current flow from Vcc through the transistors 1052 and 1024 and the antifuse 1016. The resulting OUTPUT signal is the same as described above for the read circuit 1011.

Figure 20:
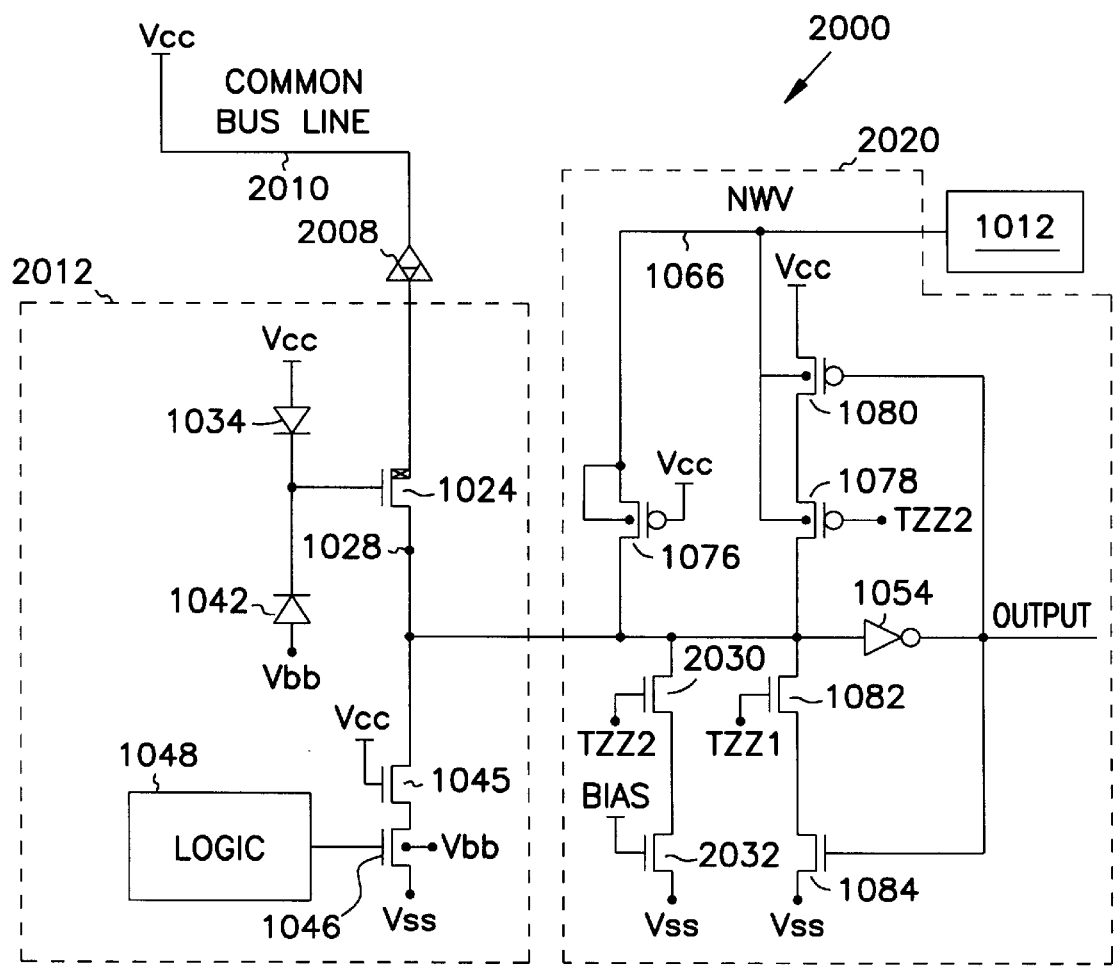
FIG. 20 is an electrical schematic diagram of support circuits for antifuses according to an embodiment of the present invention.

The antifuse 510 may be similar to the antifuse 200 shown in FIG. 2, in which case the programmed antifuse 510 will be similar to a resistor and include a ruptured gate dielectric 222 between the n-type well 210 and the n-type gate electrode 220. The antifuse 510 may then be read with Vcc on the common bus line 530 using a read circuit similar to the read circuit 1011 shown in FIG. 10. A set of support circuits 2000 including an example of such a read circuit are shown in FIG. 20 according to an embodiment of the present invention. The circuits 2000 include a programmed antifuse 2008 similar to the antifuse 200 having a first terminal coupled to a common bus line 2010. The common bus line 2010 is coupled to Vcc, and this may be called supply stealing for Vcc if it is supplied from a source external to the circuits 2000. A second terminal of the antifuse 2008 is coupled to a program driver circuit 2012 having the same elements as the program driver circuit 1010 shown in FIG. 10. Also shown is the floating well driver logic circuit 1012. The same elements have retained the same reference numerals and will not be further described herein for purposes of brevity.

A read circuit 2020 is coupled to the program driver circuit 2012 at the source terminal 1028 of the HVT 1024 and includes elements similar to the elements of the read circuit 1011 shown in FIG. 10. The similar elements have been given the same reference numerals and will not be further described for purposes of brevity. The read circuit 2020 does not include the transistors 1050 and 1052 shown in FIG. 10. Instead, a first n-channel transistor 2030 and a second n-channel transistor 2032 are coupled in series between the source terminal 1028 and Vss. The transistor 2032 is switched on by a bias voltage BIAS applied to its gate terminal, and the voltage BIAS is generated by a current mirror (not shown) to control current through the transistor 2032 to Vss at its source terminal. A drain terminal of the transistor 2032 is coupled to a source terminal of the transistor 2030, and the drain terminal of the transistor 2030 is coupled to the source terminal 1028. The gate terminal of the transistor 2030 is coupled to the signal TZZ2 which is high to switch on the transistor 2030 when the programming logic circuit 420 is in the active mode to read the antifuse 2008.

When the antifuse 2008 is read current flows from the common bus line 1020 at Vcc through the antifuse 2008 and the transistors 1024, 2030, and 2032 to Vss. The impedance of the antifuse 2008 is compared with the impedance of the transistor 2032 when it is switched on. If the antifuse 2008 is programmed and has a low impedance then a voltage at the source terminal 1028 will be close to Vcc less the threshold voltages of the diode 1034 and the HVT 1024. The inverter will invert this high voltage into a low OUTPUT signal indicating that the antifuse 2008 is programmed. If the antifuse 2008 is unprogrammed it will have a very high impedance and the voltage at the source terminal 1028 will be slightly above Vss. The inverter 1054 will invert this low voltage into a high OUTPUT signal indicating the antifuse 1016 is unprogrammed. The transistor 2032 is a long-L n-channel transistor or a long-L p-channel transistor, or it may be replaced by a resistor. The transistor 2032 may also be replaced by an upper transistor and a lower transistor of a similar type coupled in cascode to manage high voltages. The upper transistor has a gate terminal coupled to Vcc and the lower transistor has a gate terminal connected in a manner similar to the corresponding original transistor 2032.

Figure 21:
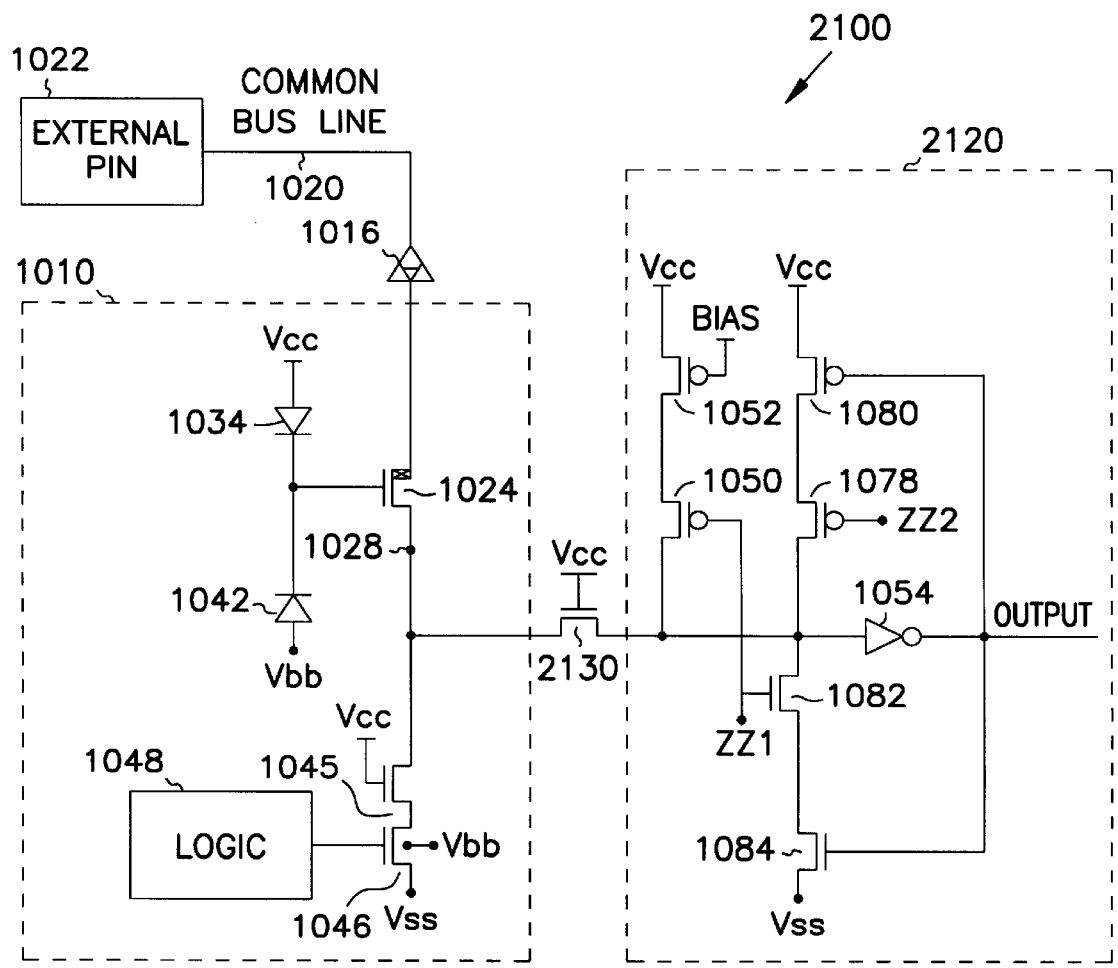
FIG. 21 is an electrical schematic diagram of support circuits for antifuses according to an embodiment of the present invention.

The logic circuit 1012 shown in FIG. 10 may not be necessary to reduce current flow in the read circuit 1011 for many reasons. For example, process parameters may result in an integrated circuit that minimizes this current, or the HVT 1024 may have characteristics which minimize this current. A pass-gate device may also reduce the need for the logic circuit 1012. A set of support circuits 2100 including a pass-gate device are shown in FIG. 21 according to an embodiment of the present invention. The circuits 2100 include elements similar to the elements of the support circuits 1000 shown in FIG. 10, and the same elements have retained the same reference numerals and will not be further described herein for purposes of brevity.

The program driver circuit 1010 is coupled to a read circuit 2120 through an n-channel pass-gate transistor 2130 according to an embodiment of the present invention. A drain of the pass-gate transistor 2130 is coupled to the source of the HVT 1024, and a source of the pass-gate transistor 2130 is coupled to the transistor 1050. Vcc is coupled to a gate of the pass-gate transistor 2130. Both of the signals ZZ1 and ZZ2 are low during the programming mode such that Vcc is coupled to the source of the pass-gate transistor 2130 to ensure that it is not conductive and substantially prevents current flow from the common bus line 1020. The voltage at the source of the pass-gate transistor 2130 will vary during the active and sleep modes.

Figure 22:
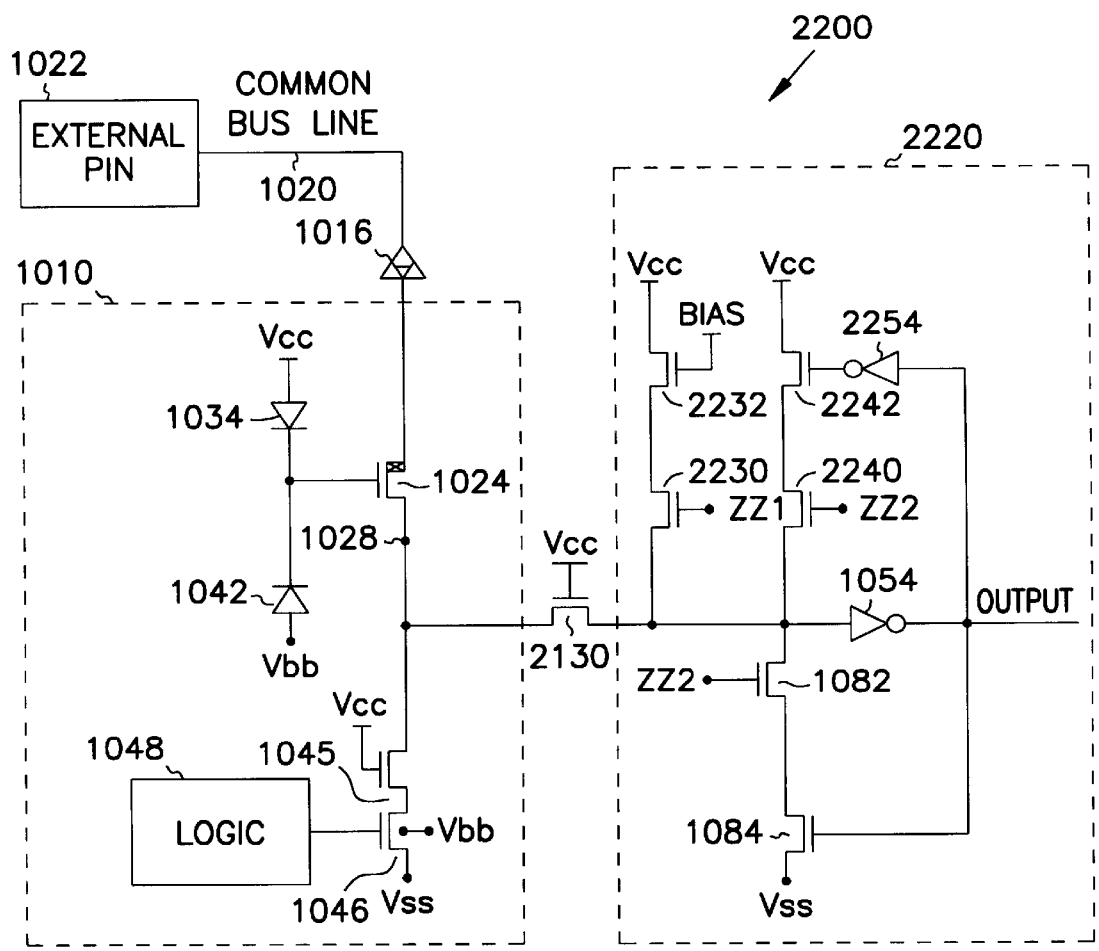
FIG. 22 is an electrical schematic diagram of support circuits for antifuses according to an embodiment of the present invention.

The use of the pass-gate transistor 2130 to reduce current flow in the read circuit 2120 may also permit the use of n-channel transistors instead of the p-channel transistors in the read circuit 2120. A set of support circuits 2200 are shown in FIG. 22 according to an embodiment of the present invention. The circuits 2200 include elements similar to the elements of the support circuits 2100 shown in FIG. 21, and the same elements have retained the same reference numerals and will not be further described herein for purposes of brevity. The program driver circuit 1010 is coupled to a read circuit 2220 through an n-channel pass-gate transistor 2130 having Vcc coupled to its gate. The pass-gate transistor 2130 substantially prevents current flow from the common bus line 1020. The read circuit 2220 includes elements similar to the elements of the read circuit 2120 shown in FIG. 21, and further includes n-channel transistors 2230, 2232, 2240, and 2242 in place of the p-channel transistors 1050, 1052, 1078, and 1080 shown in FIG. 21. The signal ZZ1 is coupled to a gate of the transistor 2230 while the signal ZZ2 is coupled to gates of the transistors 1082 and 2240. An inverted signal OUTPUT is coupled to a gate of the transistor 2242, being inverted by an inverter 2254. The read circuit 2220 operates in a manner substantially similar to the read circuit 2120.

Figure 23:
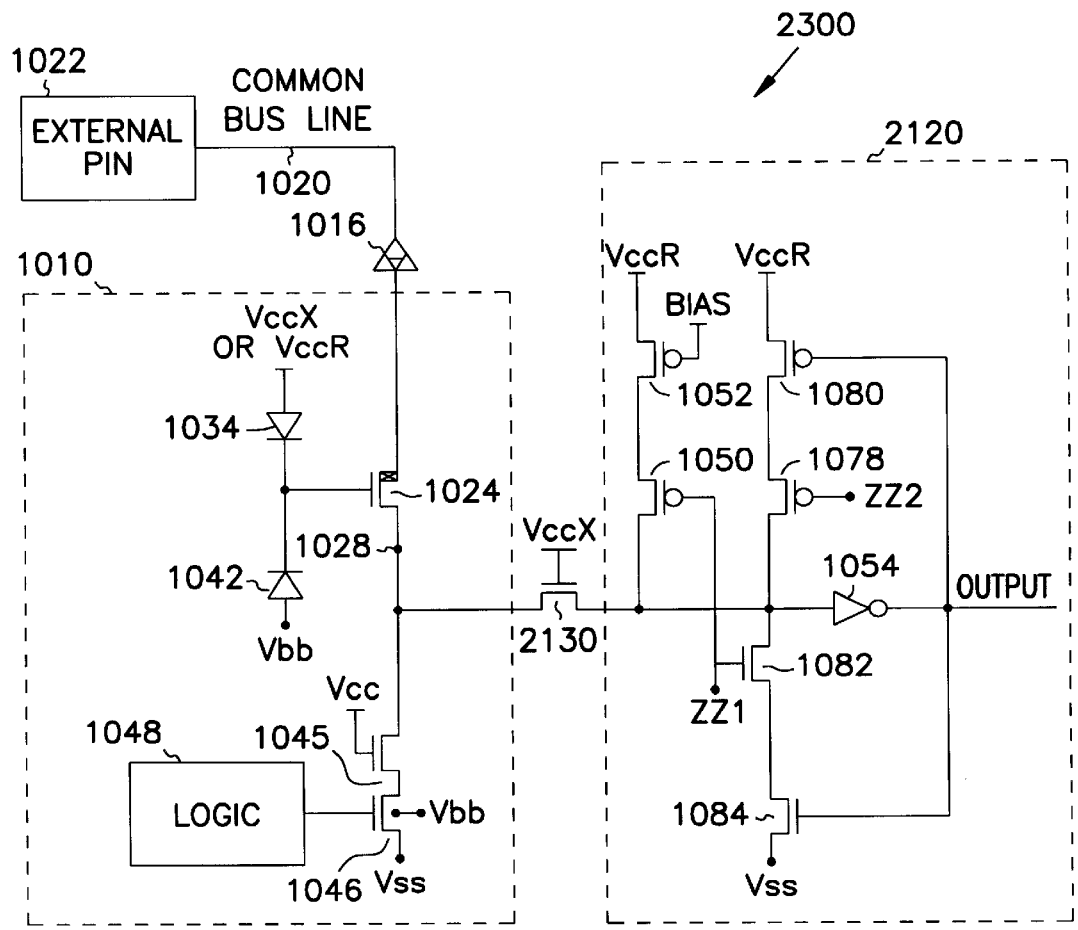
FIG. 23 is an electrical schematic diagram of support circuits for antifuses according to an embodiment of the present invention.

The pass-gate transistor 2130 shown in FIGS. 21 and 22 eliminates the need for the logic circuit 1012, but it also reduces the noise margin of the read circuits 2120 and 2220 during a read of the antifuse 1016. The noise margin is improved by using the external supply voltage VccX and the regulated supply voltage VccR described above to supply power to the read circuits 2120 and 2220. For example, a set of support circuits 2300 are shown in FIG. 23 according to an embodiment of the present invention. Most of the elements of the circuits 2300 are similar to the elements of the support circuits 2100 shown in FIG. 21, and the same elements have retained the same reference numerals and will not be further described herein for purposes of brevity. The read circuit 2120 is coupled to receive VccR on the sources of the transistors 1052 and 1080 while the gate of the pass-gate transistor 2130 is coupled to VccX. Either VccX or VccR is coupled to the anode of the diode 1034. During a read of the antifuse 1016 VccR is regulated to be less than VccX to improve the noise margin of the read circuit 2120. However, when antifuses such as the antifuse 1016 are being programmed, VccR is raised to be approximately equal to VccX. A similar use of VccR and VccX would also improve the noise margin of the circuits 2200 shown in FIG. 22.

Figure 24:
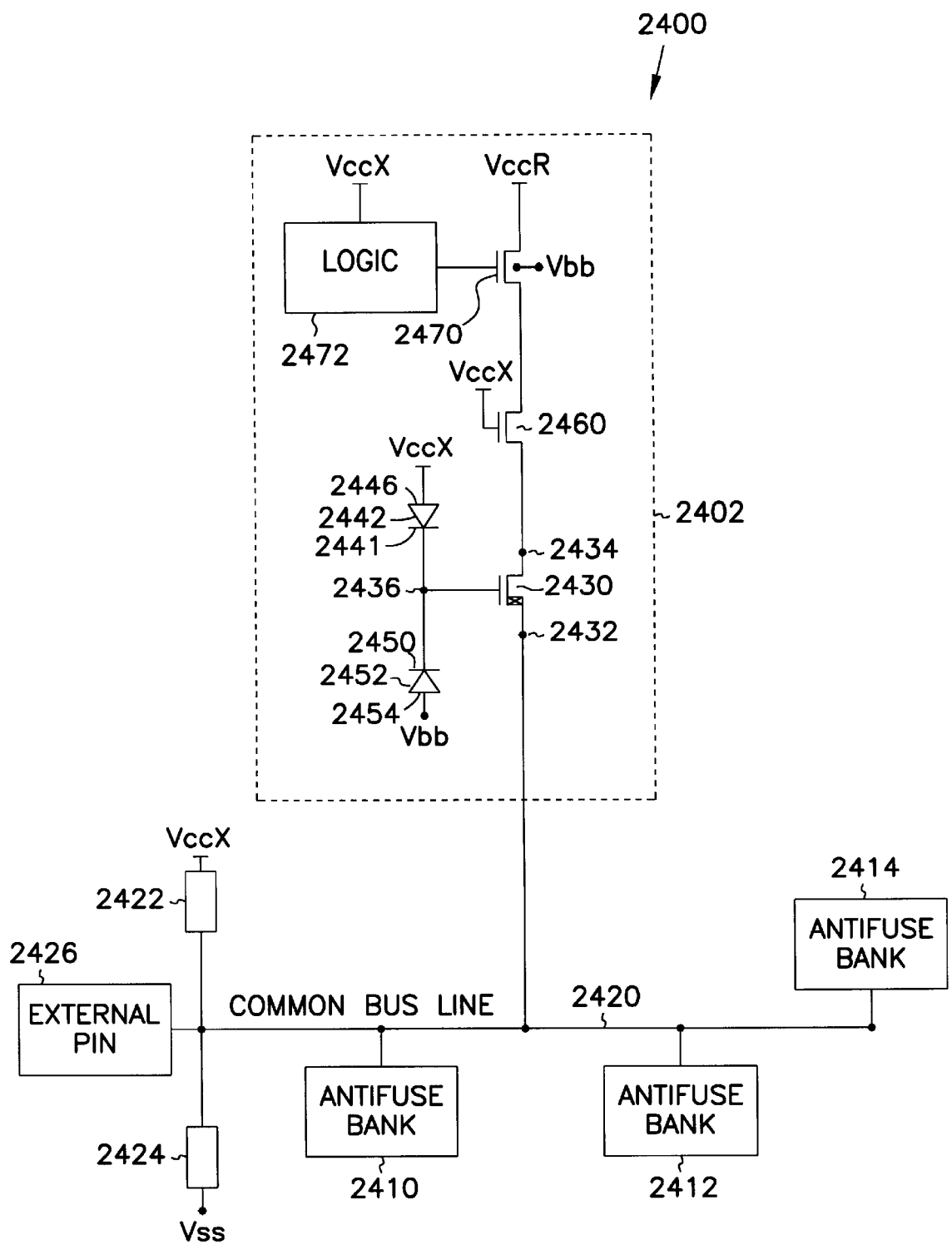
FIG. 24 is an electrical schematic diagram of an integrated circuit with a common bus line driver circuit according to an embodiment of the present invention.

The common bus line 2010 in the circuits 2000 shown in FIG. 20 is coupled to Vcc. This may be replaced by a driver circuit driven by both of the supply voltages VccX and VccR. An electrical schematic diagram of an integrated circuit 2400 with a common bus line driver circuit 2402 is shown in FIG. 24 according to an embodiment of the present invention. The integrated circuit 2400 includes three banks 2410, 2412, and 2414 of antifuses coupled to a common bus line 2420. The banks 2410, 2412, and 2414 may be similar to the bank 400 shown in FIG. 4. Integrated circuits according to other embodiments of the present invention may include more or fewer banks of antifuses. The common bus line 2420 is coupled to an ESD device 2422, 2424, and an external pin 2426 of the integrated circuit 2400. The external pin 2426 is similar to the external pin 430 shown in FIG. 4.

The common bus line driver circuit 2402 couples the common bus line 2420 to VccR when necessary. The common bus line driver circuit 2402 includes a HVT 2430 having a drain terminal 2432, a source terminal 2434, and a gate terminal 2436. The HVT 2430 is similar in structure and operating characteristics to the n-well drain transistor 600 shown in FIG. 6. The gate terminal 2436 is coupled to a cathode 2441 of a diode 2442, and an anode 2446 of the diode 2442 is coupled to VccX. The diode 2442 is forward biased as long as VccX exceeds a voltage at the gate terminal 2436. The gate terminal 2436 is also coupled to a cathode 2450 of a diode 2452. An anode 2454 of the diode 2452 is coupled to Vss. The diodes 2442 and 2452 maintain the gate terminal 2436 at a voltage slightly less than VccX, or higher.

A first n-channel transistor 2460 and a second n-channel transistor 2470 are coupled in cascode between the source terminal 2434 and VccR. A body terminal of the transistor 2470 is coupled to Vbb. A gate terminal of the transistor 2460 is coupled to VccX, and a gate terminal of the transistor 2470 is coupled to a logic circuit 2472 which controls current in the common bus line driver circuit 2402. The logic circuit 2472 is coupled to receive VccX as its supply voltage.

In the active mode the logic circuit 2472 switches on the transistor 2470 such that the common bus line 2420 is coupled to VccR. The current flows from VccR to the antifuses in the banks 2410, 2412, and 2414 as they are read in the active mode according to the description of FIG. 10 recited above. The transistors 2430, 2460, and 2470 are sized to accommodate current drawn by all of these antifuses while maintaining the common bus line 2420 near VccR.

In the programming mode the logic circuit 2472 switches off the transistor 2470 to prevent substantial current flow. This is done to maintain an elevated voltage on the common bus line 2420, and to minimize current flow from the common bus line 2420. Voltages along the common bus line driver circuit 2402 rise when the transistor 2470 is switched off to substantially end current flow, and the voltage rises on the common bus line 2420. The transistor 2430 and the diodes 2442 and 2452 function in a manner similar to the transistor 1024 and the diodes 1034 and 1042 described with reference to FIG. 10.

The program driver circuit 1010 shown in FIG. 10 and the common bus line driver circuits 1802 and 2402 may be different in alternate embodiments of the present invention. For example, the circuits 1010, 1802, and 2402 may have different HVTs, or one may have a cascode coupling of transistors and the other may have only a single corresponding transistor. The circuits 1010, 1802, and 2402 may also have different combinations of diodes such as those described with reference to FIGS. 11–16.

Figure 25:
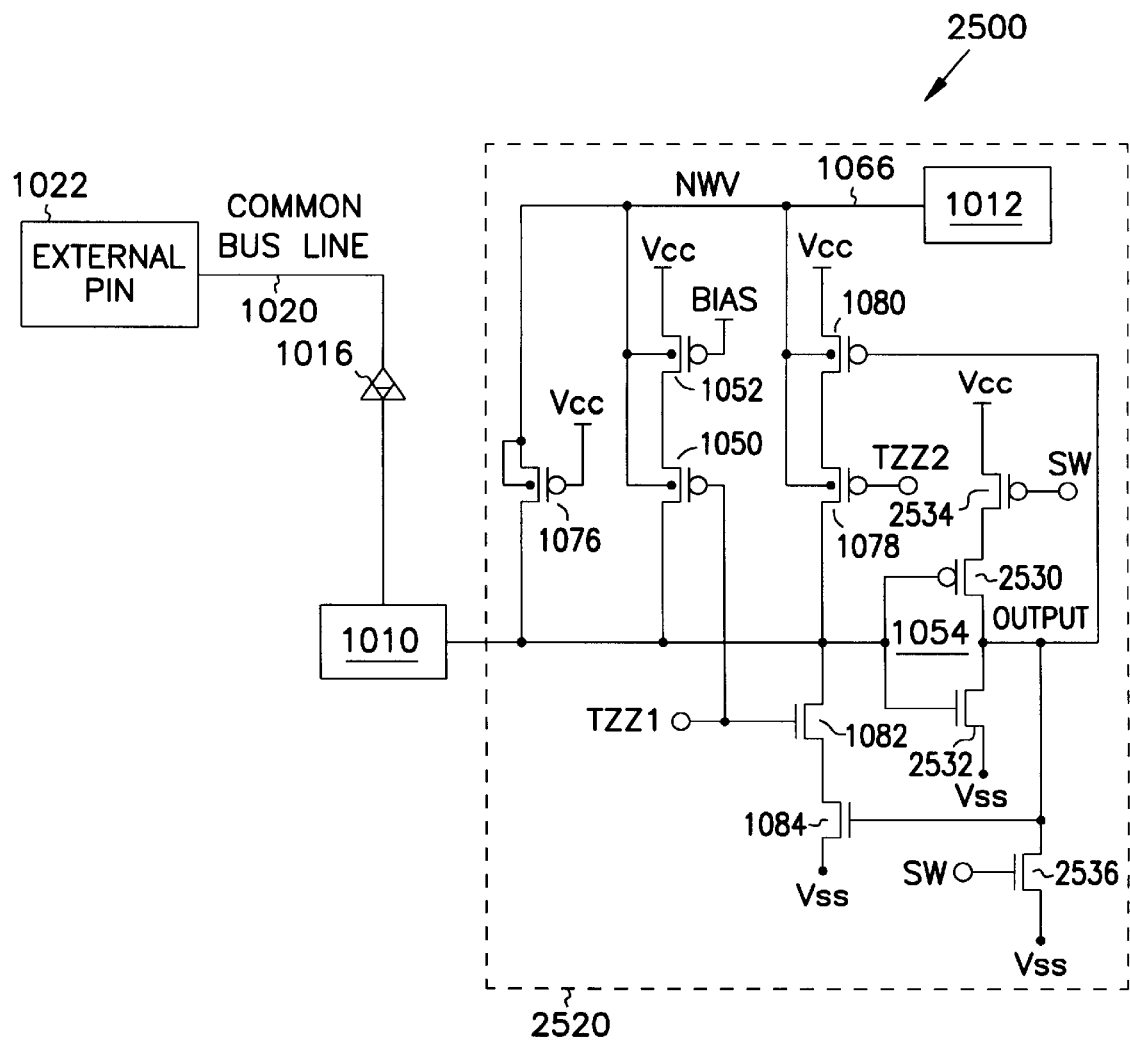
FIG. 25 is an electrical schematic diagram of support circuits for antifuses according to an embodiment of the present invention.

With reference to the circuits 1000 shown in FIG. 10, another possible source of unwanted current in the antifuse 1016 exists through the transistors 1082 and 1084. If the voltage at the source 1028 of the HVT 1024 is low, then the OUTPUT signal is high and the transistor 1084 is switched on. If this condition occurs during the programming mode the transistors 1082, 1084 may draw current through the antifuse 1016 causing damage if it is unprogrammed. A set of support circuits 2500 are shown in FIG. 25 according to an embodiment of the present invention. Most of the elements of the circuits 2500 are similar to the elements of the support circuits 1000 shown in FIG. 10, and the same elements have retained the same reference numerals and will not be further described herein for purposes of brevity. The circuits 2500 include a read circuit 2520 that has, in addition to the elements shown in FIG. 10, elements that substantially prevent current through the transistors 1082, 1084 in the programming mode. The inverter 1054 comprises a p-channel transistor 2530 and an n-channel transistor 2532 connected in series, with drains of the transistors 2530 and 2532 connected together to form the output of the inverter 1054. Gates of the transistors 2530 and 2532 are connected together to the source 1028 of the HVT 1024. A source of the transistor 2532 is coupled to Vss, and a p-channel transistor 2534 is coupled between a source of the transistor 2530 and Vcc. In addition, an n-channel transistor 2536 is coupled between the output of the inverter 1054 and Vss. The output of the inverter 1054 remains connected to the gate of the transistor 1084. Gates of the transistors 2534 and 2536 are coupled to receive a signal SW, which is shown in the following Table 2:

TABLE 2

| MODE | SW |
| --- | --- |
| PROGRAMMING | HIGH |
| ACTIVE | LOW |
| SLEEP | LOW |

In the programming mode the signal SW is high to switch off the transistor 2534 and substantially block current to the inverter 1054. The high SW signal also switches on the transistor 2536 to couple the output of the inverter 1054 to Vss and thus ensure that the transistor 1084 is switched off to substantially prevent unwanted current in the antifuse 1016. In the active and sleep modes the signal SW is low to decouple the output of the inverter 1054 from Vss and switch on the transistor 2534. The inverter 1054 is thereby coupled to Vcc and the read circuit 2520 operates similarly to the read circuit 1011 shown in FIG. 10 to read a state of the antifuse 1016.

The antifuses 100, 140, 150, 200, and 250 shown in FIGS. 1, 1A, 1B, 2, and 2A, the transistors 600, 700, 800, 860, 900, 1100, and 1700 shown in FIGS. 6, 7, 8, 8A, 9, 11, and 17, and the diodes 1200, 1300, 1400, 1500, and 1600 shown in FIGS. 12, 13, 14, 15, and 16 according to embodiments of the present invention may be formed in wells within other wells or tanks rather than the substrates shown. Such wells or tanks may be situated with other wells or tanks, or within other wells or tanks, in a larger substrate. The wells or tanks may also be situated in a silicon-on-insulator (SOI) device.

An integrated circuit fabricated with one or more of the antifuses and circuits described above may be tested in a test mode. For example, an integrated circuit having a bank of antifuses is prestressed by applying a prestress voltage that is less than the elevated voltage used to program the antifuses. The antifuses are exposed to the prestress voltage and weaker antifuses are programmed as a result. The antifuses are then read to indicate the antifuses that have been programmed. The antifuses may be read by determining their analog resistances, by detecting a digital output of an addressed antifuse, or by detecting digital output from an addressed antifuse compared with several different load elements.

Figure 26:
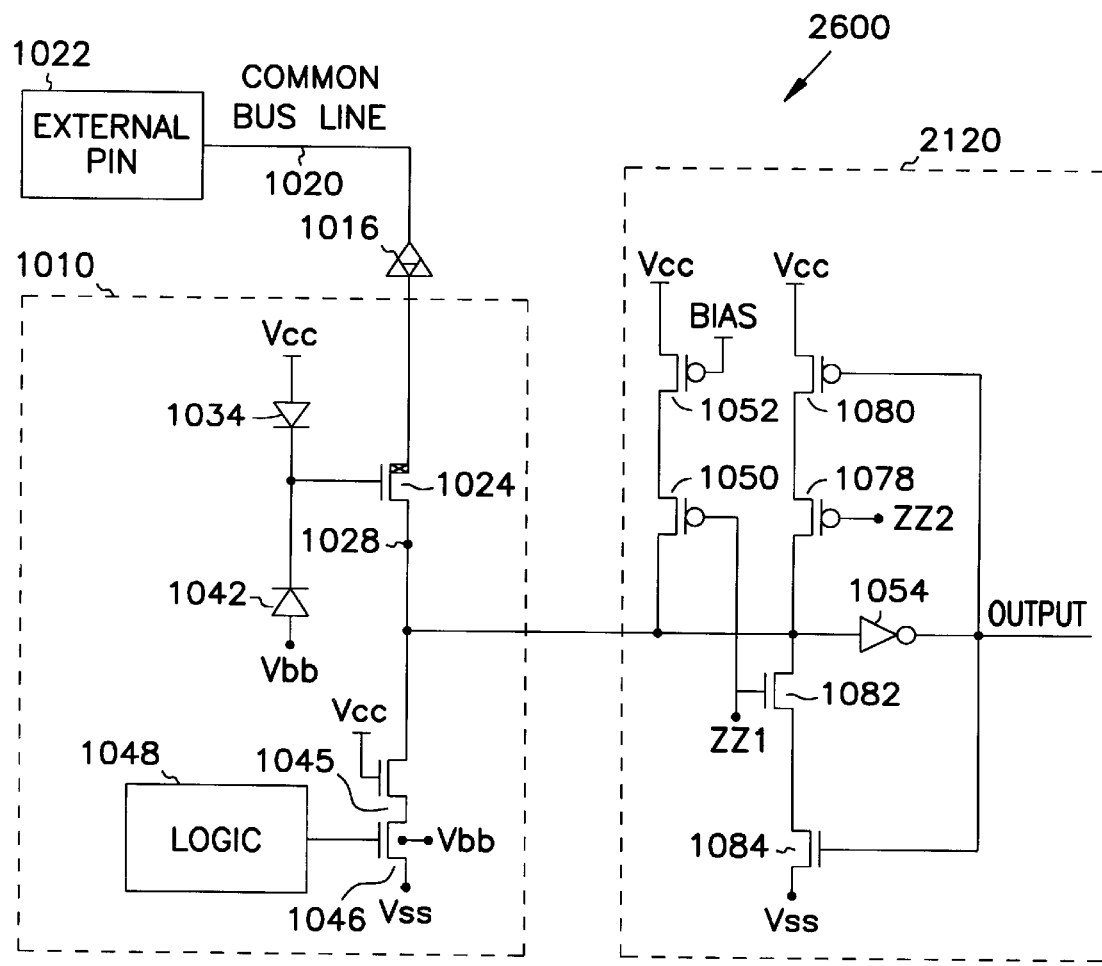
FIG. 26 is an electrical schematic diagram of support circuits for antifuses according to an embodiment of the present invention.

The logic circuit 1012 shown in FIG. 10 may not be necessary to reduce current flow in the read circuit 1011 for many reasons. For example, process parameters may result in an integrated circuit that minimizes this current, or the HVT 1024 may have characteristics which minimize this current. A set of support circuits 2600 are shown in FIG. 26 according to an embodiment of the present invention. The circuits 2600 include elements similar to the elements of the circuits 1000 shown in FIG. 10, and the same elements have retained the same reference numerals and will not be further described herein for purposes of brevity. The logic circuit 1012, the transistor 1076, and the connections to the NWV line 1066 shown in FIG. 10 are not included in the circuits 2600. The circuits 2600 operate in a manner similar to the circuits 1000 without the above-listed elements.

Figure 27:
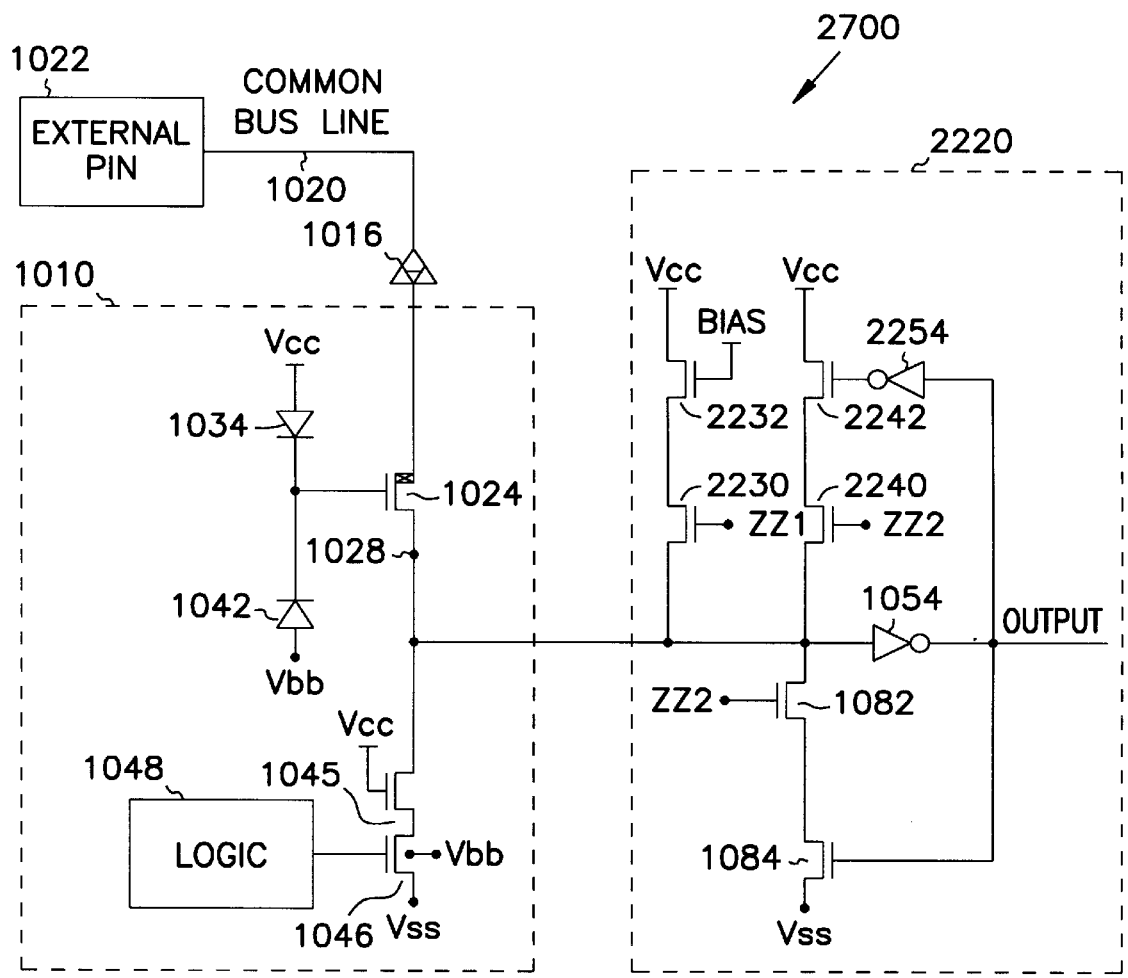
FIG. 27 is an electrical schematic diagram of support circuits for antifuses according to an embodiment of the present invention.

The pass-gate transistor 2130 shown in FIG. 22 may not be necessary to reduce current flow in the read circuit 2220 for the reasons mentioned above. A set of support circuits 2700 are shown in FIG. 27 according to an embodiment of the present invention. The circuits 2700 include elements similar to the elements of the circuits 2200 shown in FIG. 22, and the same elements have retained the same reference numerals and will not be further described herein for purposes of brevity. The pass-gate transistor 2130 shown in FIG. 22 is not included in the circuits 2700. The circuits 2700 operate in a manner similar to the circuits 2200 without the pass-gate transistor 2130.

Figure 28:
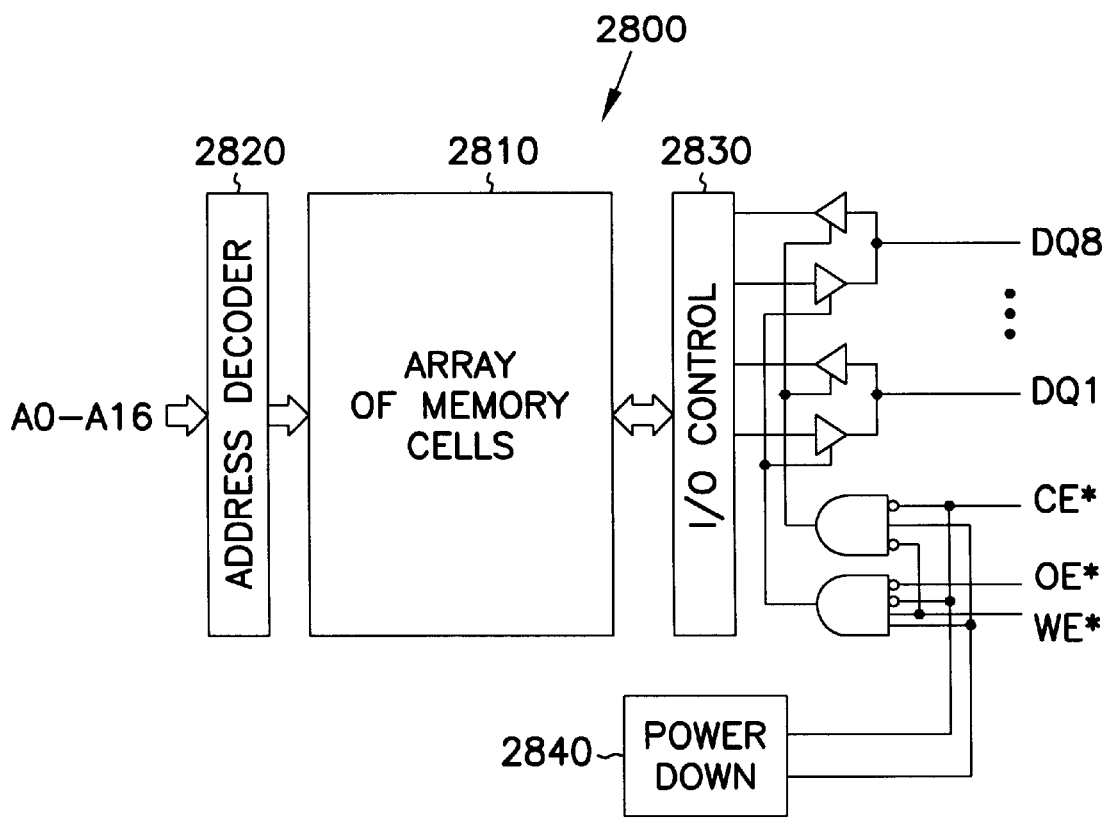
FIG. 28 is a block diagram of a static random access memory device according to an embodiment of the present invention.

A block diagram of a static random access memory device (SRAM) 2800 is shown in FIG. 28 according to an embodiment of the present invention. The SRAM 2800 may include one or more of the circuits and devices described above with respect to FIGS. 1–25 according to embodiments of the present invention. The SRAM 2800 has an array 2810 of memory cells that are accessed according to address signals provided to the SRAM 2800 at a number of address inputs A0–A16. An address decoder 2820 decodes the address signals and accesses memory cells in the array 2810 according to the address signals. Data is written to the memory cells in the array 2810 when a write enable signal WE* and a chip enable signal CE* coupled to the SRAM 2800 are both low. The data is received by the SRAM 2800 over eight data input/output (I/O) paths DQ1–DQ8. The data is coupled to the memory cells in the array 2810 from the I/O paths DQ1–DQ8 through an I/O control circuit 2830. Data is read from the memory cells in the array 2810 when the write enable signal WE* is high and an output enable signal OE* coupled to the SRAM 2800 and the chip enable signal CE* are both low. A power down circuit 2840 controls the SRAM 2800 during a power-down mode. The circuits and devices described above with respect to FIGS. 1–25 according to embodiments of the present invention may be included in other types of memory devices such as DRAMs, programmable logic devices, PROMs, EPROMs, and EEPROMs.

Figure 29:
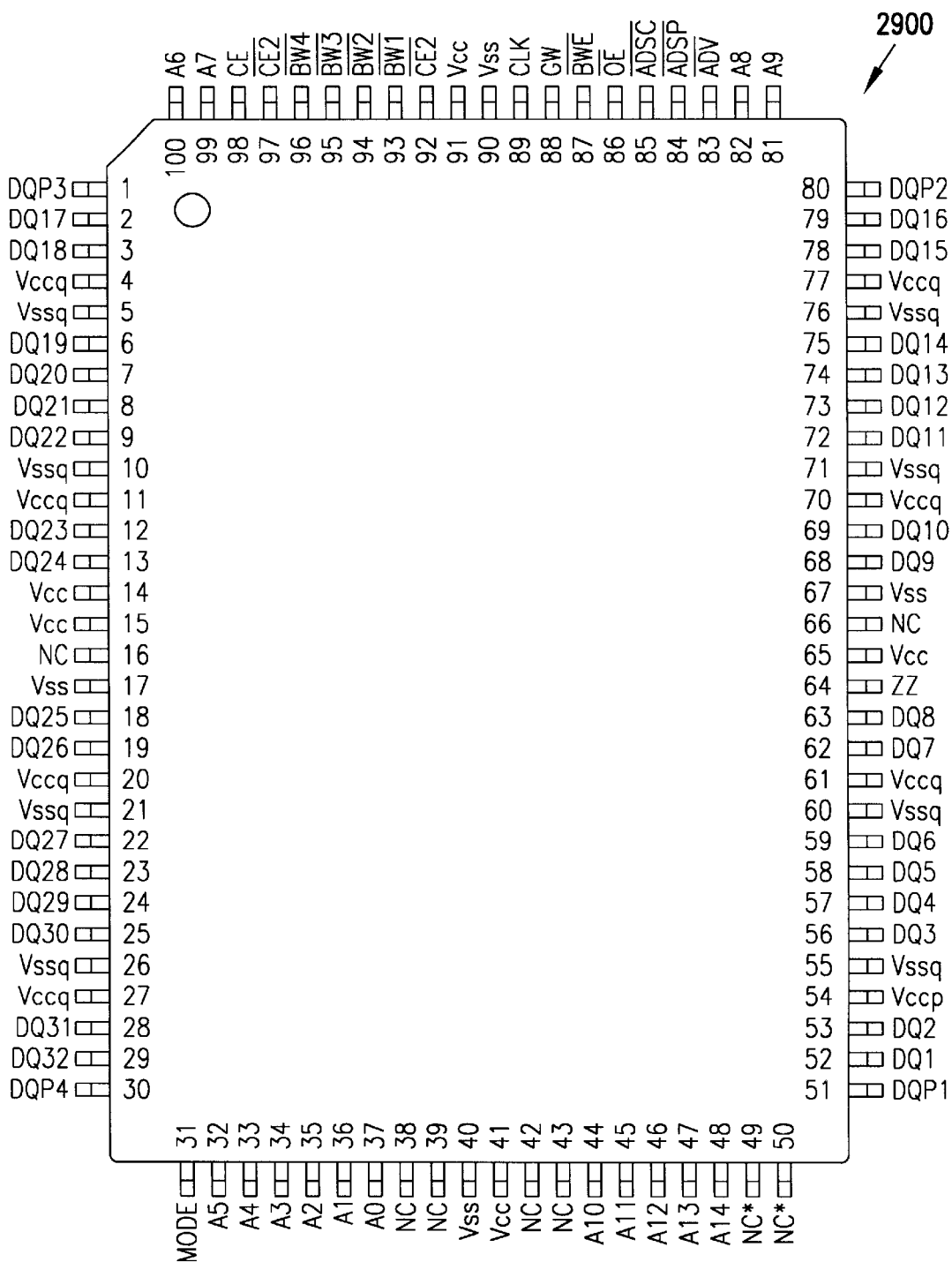
FIG. 29 is an electrical schematic diagram of an integrated circuit package according to an embodiment of the present invention.

An integrated circuit package 2900 of a 32 k×36 SRAM memory device is shown in FIG. 29 according to an embodiment of the present invention. The SRAM may include one or more of the circuits and devices described above with respect to FIGS. 1–25 according to embodiments of the present invention. One of the external pins 430, 520, 1022, 1826, or 2426 described above is one of several pins 16, 38, 39, 42, 43, or 66 in the package 2900. The pins 16, 38, 39, 42, 43, or 66 are non-reserved pins, one of which is used as one of the external pins 430, 520, 1022, 1826, or 2426. The pin selected as one of the external pins 430, 520, 1022, 1826, or 2426 will receive an elevated voltage if an antifuse in the SRAM is to be programmed. The selected pin may be left floating, or may be coupled to Vss during a normal operation of the SRAM. In an alternate embodiment of the present invention, one of the external pins 430, 520, 1022, or 1826 described above is one of several pins 17, 40, 67, or 90 coupled to Vss during the operation of the SRAM. Similarly, the external pin 2426 is one of several pins 14, 15, 41, 65, or 91 coupled to Vcc during the operation of the SRAM. This is called supply stealing, and is described above with reference to the external pin 1826 shown in FIG. 18.

Figure 30:
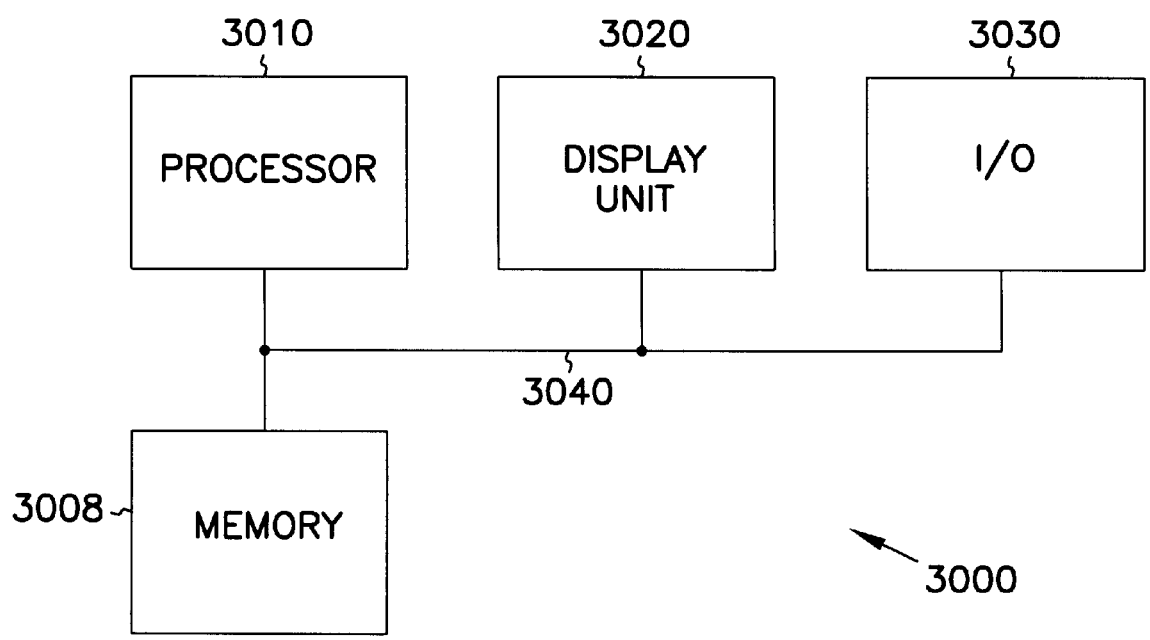
FIG. 30 is a block diagram of an information-handling system according to an embodiment of the present invention.

A block diagram of an information-handling system 3000 is shown in FIG. 30 according to an embodiment of the present invention. The information-handling system 3000 includes a memory system 3008, a processor 3010, a display unit 3020, and an input/output (I/O) subsystem 3030. The processor 3010 may be, for example, a microprocessor. One or more of the memory system 3008, the processor 3010, the display unit 3020, and the I/O subsystem 3030 may include one or more of the circuits and devices described above with respect to FIGS. 1–25 according to embodiments of the present invention. The processor 3010, the display unit 3020, the I/O subsystem 3030, and the memory system 3008 are coupled together by a suitable communication line or bus 3040. The processor 3010 and the memory system 3008 may be integrated circuits formed on a single substrate.

In various embodiments of the present invention, the information-handling system 3000 is a computer system (such as, for example, a video game, a hand-held calculator, a television set-top box, a fixed-screen telephone, a smart mobile phone, a personal digital assistant (PDA), a network computer (NC), a hand-held computer, a personal computer, or a multi-processor supercomputer), an information appliance (such as, for example, a cellular telephone or any wireless device, a pager, or a daily planner or organizer), an information component (such as, for example, a magnetic disk drive or telecommunications modem), or other appliance (such as, for example, a hearing aid, washing machine or microwave oven having an electronic controller).

Although specific embodiments have been illustrated and described herein, it will be appreciated by those skilled in the art having the benefit of this description that any equivalent arrangement may be substituted for the specific embodiments shown. For example, specific memory devices have been described and shown in the Figures. One skilled in the art having the benefit of this description will recognize that the invention may be employed in other types of memory devices and in other types of integrated circuit devices. The voltage Vbb described above may be approximately equal to Vss, or may be negative. In addition, in alternate embodiments of the present invention, the common bus line is sized to provide a programming current for more than one antifuse at the same time. The present invention is therefore limited only by the claims and equivalents thereof.

What is claimed is:

1. An integrated circuit comprising:
an external pin coupled to a common bus line to couple an elevated voltage to an antifuse having a first terminal coupled to the common bus line to program the antifuse in a programming mode;

a program driver circuit coupled to a second terminal of the antifuse to select the antifuse to be programmed in the programming mode;

a common bus line driver circuit to couple the common bus line to a reference voltage during an active mode;

a read circuit coupled to the second terminal of the antifuse to read the antifuse during the active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

2. The integrated circuit of claim 1 wherein:

the common bus line is coupled to terminals of a plurality of antifuses in an antifuse bank;

the antifuse comprises a gate dielectric between the first terminal and the second terminal of the antifuse;

the program driver circuit comprises a first high-voltage transistor and a first control transistor coupled in series between the second terminal of the antifuse and a ground voltage;

the common bus line driver circuit comprises a second high-voltage transistor and a second control transistor coupled in series between the common bus line and a ground voltage;

the read circuit comprises a transistor coupled between a read voltage and the second terminal of the antifuse to couple the read voltage to the antifuse to read the antifuse during the active mode;

the latch circuit comprises an inverter having an input coupled to the second terminal of the antifuse and to a plurality of latch circuit transistor and an output coupled to gate terminals of the latch circuit transistors; and the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor.

3. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

coupling the common bus line to a voltage reference with a common bus line driver circuit during an active mode;

reading the antifuse during the active mode with a read circuit coupled to the second terminal of the antifuse;

latching a state of the antifuse during a sleep mode with a latch circuit coupled to the second terminal of the antifuse; and switching off transistors in the read circuit and the latch circuit during the programming mode with a floating well driver logic circuit coupled to the read circuit and the latch circuit.

4. The method of claim 3 wherein:

coupling an elevated voltage to an external pin further comprises coupling the elevated voltage to terminals of a plurality of antifuses coupled to the common bus line in an antifuse bank;

selecting the antifuse to be programmed further comprises switching on a first control transistor coupled in series with a first high-voltage transistor between the second terminal of the antifuse and a ground voltage, the antifuse comprising a gate dielectric between the first terminal and the second terminal of the antifuse;

coupling the common bus line to a voltage reference further comprises switching on a second control transistor to couple the common bus line to a ground voltage through a second high-voltage transistor and the second control transistor coupled together in series;

reading the antifuse further comprises coupling the ground voltage to the first terminal of the antifuse, coupling a read voltage to the second terminal of the antifuse through a transistor, and detecting a voltage of the second terminal of the antifuse to read the antifuse;

latching a state of the antifuse further comprises latching the voltage of the second terminal of the antifuse with a latch circuit including an inverter and a plurality of latch transistor; and switching off transistors in the read circuit and the latch circuit further comprises raising a voltage of a gate terminal and a well of a p-channel transistor to substantially prevent current in the p-channel transistor.

5. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a common bus line driver circuit to couple the common bus line to a voltage reference during an active mode, the commmon bus line driver circuit comprising:
  a first high-voltage transistor having a first terminal coupled to the common bus line, a control terminal, and a second terminal;
  a diode coupled between the control terminal and a voltage reference; and
  a first control transistor coupled between the second terminal of the high-voltage transistor and a voltage reference;

a read circuit coupled to the second terminal of the antifuse to read the antifuse during the active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

6. The integrated circuit of claim 5 wherein:

the common bus line is coupled to terminals of a plurality of antifuses in an antifuse bank;

the antifuse comprises a gate dielectric between the first terminal and the second terminal of the antifuse;

the program driver circuit comprises a second high-voltage transistor and a second control transistor coupled in series between the second terminal of the antifuse and a ground voltage;

the read circuit comprises a transistor coupled between a read voltage and the second terminal of the antifuse to couple the read voltage to the antifuse to read the antifuse during the active mode;

the latch circuit comprises an inverter having an input coupled to the second terminal of the antifuse and to a plurality of latch circuit transistors and an output coupled to gate terminals of the latch circuit transistors;

the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor;

the first high-voltage transistor comprises an n-well drain transistor having a drain terminal coupled to the common bus line, a control terminal coupled to the diode, and a source terminal coupled to the first control transistor;

the diode comprises:
  a first diode comprising an anode coupled to a voltage supply and a cathode coupled to the control terminal of the n-well drain transistor; and
  a second diode comprising a cathode coupled to the control terminal of the n-well drain transistor and an anode coupled to a voltage reference to withstand a high voltage on the control terminal of the n-well drain transistor; and the first control transistor is coupled between the source terminal of the n-well drain transistor and a ground voltage to couple the common bus line to the ground voltage when the first control transistor is switched on and to permit the elevated voltage on the common bus line when the first control transistor is switched off.

7. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

switching off a first control transistor in a common bus line driver circuit coupled between the common bus line and a voltage reference to substantially prevent current flow from the common bus line through the common bus line driver circuit during the programming mode;

bearing a portion of the elevated voltage across a first high-voltage transistor in the common bus line driver circuit, the first high-voltage transistor having a first terminal coupled to the common bus line, a control terminal, and a second terminal coupled to the first control transistor during the programming mode;

bearing a portion of the elevated voltage between a diode and the control terminal of the first high-voltage transistor during the programming mode;

switching on the first control transistor to couple the common bus line to the voltage reference during an active mode;

reading the antifuse during the active mode with a read circuit coupled to the second terminal of the antifuse;

latching a state of the antifuse during a sleep mode with a latch circuit coupled to the second terminal of the antifuse; and switching off transistors in the read circuit and the latch circuit during the programming mode with a floating well driver logic circuit coupled to the read circuit and the latch circuit.

8. The method of claim 7 wherein:

coupling an elevated voltage to an external pin further comprises coupling the elevated voltage to terminals of a plurality of antifuses coupled to the common bus line in an antifuse bank;

selecting the antifuse to be programmed further comprises switching on a second control transistor coupled in series with a second high-voltage transistor between the second terminal of the antifuse and a ground voltage, the antifuse comprising a gate dielectric between the first terminal and the second terminal of the antifuse;

reading the antifuse comprises coupling a ground voltage to the first terminal of the antifuse, coupling a read voltage to the second terminal of the antifuse through a transistor, and detecting a voltage of the second terminal of the antifuse to read the antifuse;

latching a state of the antifuse further comprises latching the voltage of the second terminal of the antifuse with a latch circuit including an inverter and a plurality of latch transistors;

switching off transistors in the read circuit and the latch circuit further comprises raising a voltage of a gate terminal and a well of a p-channel transistor to substantially prevent current in the p-channel transistor;

switching off a first control transistor further comprises switching off the first control transistor comprising an n-channel transistor;

bearing a portion of the elevated voltage across a first high-voltage transistor further comprises bearing a portion of the elevated voltage across an n-well drain transistor having a drain terminal coupled to the common bus line, a control terminal coupled to the diode, and a source terminal coupled to the first control transistor; and bearing a portion of the elevated voltage between a diode and the control terminal further comprises bearing a portion of the elevated voltage between the control terminal of the n-well drain transistor, a first diode comprising an anode coupled to a voltage supply and a cathode coupled to the control terminal of the n-well drain transistor, and a second diode comprising a cathode coupled to the control terminal of the n-well drain transistor and an anode coupled to a voltage reference.

9. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a common bus line driver circuit to couple the common bus line to a voltage reference during an active mode;

a read circuit comprising a read transistor coupled between a read voltage and the second terminal of the antifuse to couple the read voltage to the antifuse to read the antifuse during the active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

10. The integrated circuit of claim 9 wherein:

the common bus line is coupled to terminals of a plurality of antifuses in an antifuse bank;

the antifuse comprises a gate dielectric between a first terminal and the second terminal of the antifuse;

the program driver circuit comprises a first high-voltage transistor and a first control transistor coupled in series between the second terminal of the antifuse and a ground voltage;

the common bus line driver circuit comprises a second high-voltage transistor and a second control transistor coupled in series between the common bus line and a ground voltage;

the read transistor comprises a p-channel transistor having a source terminal coupled to the read voltage and a gate terminal coupled to a bias voltage;

the latch circuit comprises an inverter having an input coupled to the second terminal of the antifuse and to a plurality of latch circuit transistors and an output coupled to gate terminals of the latch circuit transistors; and the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor.

11. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

coupling the common bus line to a voltage reference with a common bus line driver circuit during an active mode;

reading the antifuse with a read circuit during the active mode comprising:
 coupling a read voltage to the second terminal of the antifuse through a read transistor; and
 detecting a voltage of the second terminal of the antifuse to read the antifuse;

latching a state of the antifuse during a sleep mode with a latch circuit coupled to the second terminal of the antifuse; and switching off transistors in the read circuit and the latch circuit during the programming mode with a floating well driver logic circuit coupled to the read circuit and the latch circuit.

12. The method of claim 11 wherein:

coupling an elevated voltage to an external pin further comprises coupling the elevated voltage to terminals of a plurality of antifuses coupled to the common bus line in an antifuse bank;

selecting the antifuse to be programmed further comprises switching on a first control transistor coupled in series with a first high-voltage transistor between the second terminal of the antifuse and a ground voltage, the antifuse comprising a gate dielectric between the first terminal and the second terminal of the antifuse;

coupling the common bus line to a voltage reference further comprises switching on a second control transistor to couple the common bus line to a ground voltage through a second high-voltage transistor and the second control transistor coupled together in series;

coupled a read voltage further comprises coupling the read voltage to the second terminal of the antifuse through a p-channel transistor switched on by a bias voltage;

detecting a voltage further comprises detecting the voltage of the second terminal of the antifuse with an input of an inverter during the active mode;

latching a state of the antifuse further comprises latching the voltage of the second terminal of the antifuse with a latch circuit including an inverter and a plurality of latch transistor; and switching off transistors in the read circuit and the latch circuit further comprises raising a voltage of a gate terminal and a well of a p-channel transistor of substantially prevent current in the p-channel transistor.

13. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a common bus line driver circuit to couple the common bus line to a voltage reference during an active mode;

a read circuit comprising a p-channel transistor coupled between a read voltage source and the second terminal of the antifuse to couple the read voltage source to the antifuse to read the antifuse during the active mode;

a latch circuit coupled to the second terminal of the antifuse to latch a state of the antifuse during a sleep mode; and a floating well driver logic circuit coupled to a gate terminal and a well of the p-channel transistor to raise a voltage of the gate terminal and the well during the programming mode to substantially prevent current in the p-channel transistor.

14. The integrated circuit of claim 13 wherein:

the common bus line is coupled to terminals of a plurality of antifuses in an antifuse bank;

the antifuse comprises a gate dielectric between the first terminal and the second terminal of the antifuse;

the program driver circuit comprises a first high-voltage transistor and a first control transistor coupled in series between the second terminal of the antifuse and a ground voltage;

the common bus line driver circuit comprises a second high-voltage transistor and a second control transistor coupled in series between the common bus line and a ground voltage;

the read circuit further comprises a plurality of p-channel transistors, one of the p-channel transistors being coupled between the second terminal of the antifuse and the floating well driver logic circuit to couple a rising voltage on the second terminal of the antifuse to the floating well driver logic circuit;

the latch circuit comprises an inverter having an input coupled to the second terminal of the antifuse and to a plurality of latch circuit transistor and an output coupled to gate terminals of the latch circuit transistors; and the floating well driver logic circuit further comprises a voltage source coupled to a gate terminal and a well of selected ones of the p-channel transistors in the read circuit to raise a voltage of the gate terminals and the wells during the programming mode to substantially prevent current in the selected p-channel transistors.

15. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

coupling the common bus line to a voltage reference with a common bus line driver circuit during an active mode;

reading the antifuse during the active mode with a p-channel transistor in a read circuit coupled between a read voltage source and the second terminal of the antifuse;

latching a state of the antifuse during a sleep mode with a latch circuit coupled to the second terminal of the antifuse; and raising a voltage of a gate terminal and a well of the p-channel transistor during the programming mode to substantially prevent current in the p-channel transistor.

16. The method of claim 15 wherein:

coupling an elevated voltage to an external pin further comprises coupling the elevated voltage to terminals of a plurality of antifuses coupled to the common bus line in an antifuse bank;

selecting the antifuse to be programmed further comprises switching on a first control transistor coupled in series with a first high-voltage transistor between the second terminal of the antifuse and a ground voltage, the antifuse comprising a gate dielectric between the first terminal and the second terminal of the antifuse;

coupling the common bus line to a voltage reference further comprises switching on a second control transistor to couple the common bus line to a ground voltage through a second high-voltage transistor and the second control transistor coupled together in series;

reading the antifuse further comprises detecting a voltage of the second terminal of the antifuse with an inverter in the read circuit;

latching a state of the antifuse further comprises latching the voltage of the second terminal of the antifuse with a latch circuit including an inverter and a plurality of latch transistors; and raising a voltage further comprises coupling a rising voltage of the second terminal of the antifuse to a gate terminal and a well of each of a plurality of p-channel transistors in the read circuit.

17. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a common bus line driver circuit to couple the common bus line to a voltage reference during an active mode;

a read circuit coupled to the second terminal of the antifuse to read the antifuse during the active mode;

a latch circuit coupled to the second terminal of the antifuse to latch a state of the antifuse during a sleep mode; and means for switching off transistors in the read circuit and the latch circuit during the programming mode.

18. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a common bus line driver circuit to couple the common bus line to a voltage reference during an active mode;

a read circuit coupled to the second terminal of the antifuse to read the antifuse during the active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

19. The integrated circuit of claim 18 wherein:

the common bus line is coupled to terminals of a plurality of antifuses in an antifuse bank;

the antifuse comprises a gate dielectric between the first terminal and the second terminal of the antifuse;

the program driver circuit comprises a first high-voltage transistor and a first control transistor coupled in series between the second terminal of the antifuse and a ground voltage;

the common bus line driver circuit comprises a second high-voltage transistor and a second control transistor coupled in series between the common bus line and a ground voltage;

the read circuit comprises a transistor coupled between a read voltage and the second terminal of the antifuse to couple the read voltage to the antifuse to read the antifuse during the active mode;

the latch circuit comprises an inverter having an input coupled to the second terminal of the antifuse and to a plurality of latch circuit transistors and an output coupled to gate terminals of the latch circuit transistors; and the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor.

20. An integrated circuit comprising:

an external pin coupled to a common bus line to couple an elevated voltage to an antifuse having a first terminal coupled to the common bus line to program the antifuse in a programming mode;

a program driver circuit coupled to a second terminal of the antifuse to select the antifuse to be programmed in the programming mode;

a read circuit coupled to the second terminal of the antifuse to read the antifuse during an active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

21. The integrated circuit of claim 20 wherein:

the common bus line is coupled to terminals of a plurality of antifuses in an antifuse bank;

the antifuse comprises a gate dielectric between the first terminal and the second terminal of the antifuse;

the program driver circuit comprises a high-voltage transistor and a control transistor coupled in series between the second terminal of the antifuse and a ground voltage;

the read circuit comprises a transistor coupled between a read voltage and the second terminal of the antifuse to couple the read voltage to the antifuse to read the antifuse during the active mode;

the latch circuit comprises an inverter having an input coupled to the second terminal of the antifuse and to a plurality of latch circuit transistors and an output coupled to gate terminals of the latch circuit transistors; and the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor.

22. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

reading the antifuse during an active mode with a read circuit coupled to the second terminal of the antifuse;

latching a state of the antifuse during a sleep mode with a latch circuit coupled to the second terminal of the antifuse; and switching off transistors in the read circuit and the latch circuit during the programming mode with a floating well driver logic circuit coupled to the read circuit and the latch circuit.

23. The method of claim 22 wherein:

coupling an elevated voltage to an external pin further comprises coupling the elevated voltage to terminals of a plurality of antifuses coupled to the common bus line in an antifuse bank;

selecting the antifuse to be programmed further comprises switching on a control transistor coupled in series with a high-voltage transistor between the second terminal of the antifuse and a ground voltage, the antifuse comprising a gate dielectric between the first terminal and the second terminal of the antifuse;

reading the antifuse further comprises coupling the ground voltage to the first terminal of the antifuse, coupling a read voltage to the second terminal of the antifuse through a transistor, and detecting a voltage of the second terminal of the antifuse to read the antifuse;

latching a state of the antifuse further comprises latching the voltage of the second terminal of the antifuse with a latch circuit including an inverter and a plurality of latch transistors; and switching off transistors in the read circuit and the latch circuit further comprises raising a voltage of a gate terminal and a well of a p-channel transistor to substantially prevent current in the p-channel transistor.

24. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a read circuit comprising a read transistor coupled between a read voltage and the second terminal of the antifuse to couple the read voltage to the antifuse to read the antifuse during an active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

25. The integrated circuit of claim 24 wherein:

the common bus line is coupled to terminals of a plurality of antifuses in an antifuse bank;

the antifuse comprises a gate dielectric between the first terminal and the second terminal of the antifuse;

the program driver circuit comprises a high-voltage transistor and a control transistor coupled in series between the second terminal of the antifuse and a ground voltage;

the read transistor comprises a p-channel transistor having a source terminal coupled to the read voltage and a gate terminal coupled to a bias voltage;

the latch circuit comprises an inverter having an input coupled to the second terminal of the antifuse and to a plurality of latch circuit transistors and an output coupled to gate terminals of the latch circuit transistors; and the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor.

26. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

reading the antifuse with a read circuit during an active mode comprising;

coupling a read voltage to the second terminal of the antifuse through a read transistor; and detecting a voltage of the second terminal of the antifuse to read the antifuse;

latching a state of the antifuse during a sleep mode with a latch circuit coupled to the second terminal of the antifuse; and switching off transistors in the read circuit and the latch circuit during the programming mode with a floating well driver logic circuit coupled to the read circuit and the latch circuit.

27. The method of claim 26 wherein:

coupling an elevated voltage to an external pin further comprises coupling the elevated voltage to terminals of a plurality of antifuses coupled to the common bus line in an antifuse bank;

selecting the antifuse to be programmed further comprising switching on a control transistor coupled in series with a high-voltage transistor between the second terminal of the antifuse and a ground voltage, the antifuse comprising a gate dielectric between the first terminal and the second terminal of the antifuse;

coupling a read voltage further comprises coupling the read voltage to the second terminal of the antifuse through a p-channel transistor switched on by a bias voltage;

detecting a voltage further comprises detecting the voltage of the second terminal of the antifuse with an input of an inverter during the active mode;

latching a state of the antifuse further comprises latching the voltage of the second terminal of the antifuse with a latch circuit including an inverter and a plurality of latch transistors; and switching off transistors in the read circuit and the latch circuit further comprises raising a voltage of a gate terminal and a well of a p-channel transistor to substantially prevent current in the p-channel transistor.

28. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a read circuit comprising a p-channel transistor coupled between a read voltage source and the second terminal of the antifuse to couple the read voltage source to the antifuse to read the antifuse during an active mode;

a latch circuit coupled to the second terminal of the antifuse to latch a state of the antifuse during a sleep mode; and a floating well driver logic circuit coupled to a gate terminal and a well of the p-channel transistor to raise a voltage of the gate terminal and the well during the programming mode to substantially prevent current in the p-channel transistor.

29. The integrated circuit of claim 28 wherein:

the common bus line is coupled to terminals of a plurality of antifuses in an antifuse bank;

the antifuse comprises a gate dielectric between the first terminal and the second terminal of the antifuse;

the program driver circuit comprises a high-voltage transistor and a control transistor coupled in series between the second terminal of the antifuse and a ground voltage;

the read circuit further comprises a plurality of p-channel transistors, one of the p-channel transistors being coupled between the second terminal of the antifuse and the floating well driver logic circuit to couple a rising voltage on the second terminal of the antifuse to the floating well driver logic circuit;

the latch circuit comprises an inverter having in input coupled to the second terminal of the antifuse and to a plurality of latch circuit transistors and an output coupled to gate terminals of the latch circuit transistors; and the floating well driver logic circuit further comprises a voltage source coupled to a gate terminal and a well of selected ones of the p-channel transistors in the read circuit to raise a voltage of the gate terminals and the wells during the programming mode to substantially prevent current in the selected p-channel transistors.

30. A method of operating an integrated circuit comprising:

coupling an elevated voltage to an external pin coupled to a common bus line and a first terminal of an antifuse to program the antifuse with the elevated voltage during a programming mode;

selecting the antifuse to be programmed during the programming mode with a program driver circuit coupled to a second terminal of the antifuse;

reading the antifuse duringan active mode with a p-channel transistor in a read circuit coupled between a read voltage source and the second terminal of the antifuse;

latching a state of the antifuse during a sleep mode with a latch circuit coupled to the second terminal of the antifuse; and raising a voltage of a gate terminal and a well of the p-channel transistor during the programming mode to substantially prevent current in the p-channel transistor.

31. The method of claim 30 wherein:

coupling an elevated voltage to an external pin further comprises coupling the elevated voltage to terminals of a plurality of antifuses coupled to the common bus line in an antifuse bank;

selecting the antifuse to be programmed further comprises switching on a control transistor coupled in series with a high-voltage transistor between the second terminal of the antifuse and a ground voltage, the antifuse comprising a gate dielectric between the first terminal and the second terminal of the antifuse;

reading the antifuse further comprises detecting a voltage of the second terminal of the antifuse with an inverter in the read circuit;

latching a state of the antifuse further comprises latching the voltage of the second terminal of the antifuse with a latch circuit including an inverter and a plurality of latch transistors; and raising a voltage further comprises coupling a rising voltage of the second terminal of the antifuse to a gate terminal and a well of each of a plurality of p-channel transistors in the read circuit.

32. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a read coupled to the second terminal of the antifuse to read the antifuse during an active mode;

a latch circuit coupled to the second terminal of the antifuse to latch a state of the antifuse during a sleep mode; and means for switching off transistors in the read circuit and the latch circuit during the programming mode.

33. An integrated circuit comprising:

an external pin coupled to a common bus line to couple an elevated voltage to an antifuse having a first terminal coupled to the common bus line to program the antifuse during a programming mode;

a program driver circuit coupled to a second terminal of the antifuse to select the antifuse to be programmed during the programming mode;

a read circuit coupled to the second terminal of the antifuse to read the antifuse during an active mode;

a latch circuit coupled to the second terminal of the antifuse to latch a state of the antifuse during a sleep mode; and a floating well driver logic circuit coupled to the read circuit and the latch circuit to switch off transistors in the read circuit and the latch circuit during the programming mode.

34. The integrated circuit of claim 33 wherein:

the common bus line is coupled to terminals of a plurality of antifuses in an antifuse bank;

the antifuse comprises a gate dielectric between the first terminal and the second terminal of the antifuse;

the program driver circuit comprises a high-voltage transistor and a control transistor coupled in series between the second terminal of the antifuse and a ground voltage;

the read circuit comprises a transistor coupled between a read voltage and the second terminal of the antifuse to couple the read voltage to the antifuse to read the antifuse during the active mode;

the latch circuit comprises an inverter having an input coupled to the second terminal of the antifuse and to a plurality of latch circuit transistors and an output coupled to gate terminals of the latch circuit transistors; and the floating well driver logic circuit further comprises a circuit coupled to a gate terminal and a well of a p-channel transistor in the read circuit or the latch circuit to raise a voltage of the gate terminal and the well during the programming mode to substantially prevent current in the p-channel transistor.

* * * * *